(12) United States Patent
Hansen et al.

(10) Patent No.: US 11,760,276 B2
(45) Date of Patent: Sep. 19, 2023

(54) VEHICLE INTERIOR COMPONENT

(71) Applicant: Shanghai Yanfeng Jinqiao Automotive Trim Systems Co. Ltd., Novi, MI (US)

(72) Inventors: Scott Allen Hansen, Holland, MI (US); Anthony DeGrote, Hudsonville, MI (US); Chris J. Harmelink, Wyoming, MI (US)

(73) Assignee: Shanghai Yanfeng Jinqiao Automotive Trim Systems Co. Ltd., Novi, MI (US)

( * ) Notice: Subject to any disclaimer, the term of this patent is extended or adjusted under 35 U.S.C. 154(b) by 191 days.

(21) Appl. No.: 16/991,714

(22) Filed: Aug. 12, 2020

(65) Prior Publication Data

US 2020/0369223 A1  Nov. 26, 2020

Related U.S. Application Data

(63) Continuation of application No. PCT/US2019/019617, filed on Feb. 26, 2019.

(Continued)

(51) Int. Cl.
*B32B 21/14* (2006.01)
*B32B 7/023* (2019.01)
(Continued)

(52) U.S. Cl.
CPC .......... *B60R 13/0256* (2013.01); *B32B 7/023* (2019.01); *B32B 21/14* (2013.01);
(Continued)

(58) Field of Classification Search
CPC ... B32B 9/042; B32B 9/045; B60K 2370/152; B60K 2370/28; B60K 2370/331;
(Continued)

(56) References Cited

U.S. PATENT DOCUMENTS

2002/0031620 A1\*  3/2002  Yuzawa ................ B44C 5/0453
                                                      362/362
2009/0058118 A1   3/2009  Hein et al.
(Continued)

FOREIGN PATENT DOCUMENTS

DE   102015120120 A1   5/2017
DE   202017105063      8/2018
WO   2018/013557       1/2018

OTHER PUBLICATIONS

Extended EP Search Report for European Application No. 19757841.2 dated Oct. 5, 2021, 7 pages.

(Continued)

*Primary Examiner* — Hong Zhou
(74) *Attorney, Agent, or Firm* — Amin, Turocy & Watson LLP

(57) ABSTRACT

A vehicle interior component is disclosed. The component provides a user interface with a display/image when illuminated. The component comprises a composite structure with a cover material providing a light-transmissive effect and a surface providing a surface effect (grain/wood texture) visible when the display is off. The image is presented at the cover surface when the display is on. The cover may comprise a wood veneer with backing (paper, fiber material, etc.). The composite structure may comprise a mask layer and a lens, filter, colorant, etc. The user interface may include a sensor. The light source may comprise a display panel, LED/array, module, etc. The image is visible at the user interface when display functionality is in operation; when display functionality is not in operation the surface effect of the cover (e.g. wood texture) is visible with substantially no indication of display functionality.

19 Claims, 13 Drawing Sheets

Related U.S. Application Data

(60) Provisional application No. 62/635,359, filed on Feb. 26, 2018.

(51) Int. Cl.
*B60R 11/02* (2006.01)
*B60R 13/02* (2006.01)
*G06F 3/044* (2006.01)
*G09G 3/34* (2006.01)
*B60R 11/00* (2006.01)

(52) U.S. Cl.
CPC .......... *B60R 11/0229* (2013.01); *G06F 3/044* (2013.01); *G09G 3/3406* (2013.01); *B32B 2307/414* (2013.01); *B32B 2605/003* (2013.01); *B60R 2011/0005* (2013.01); *G09G 2354/00* (2013.01); *G09G 2380/10* (2013.01)

(58) Field of Classification Search
CPC .. B60K 2370/339; B60K 35/00; B60K 37/00; B60R 11/0229; B60R 13/0256; B60R 2011/0005; G06F 2203/04101; G06F 2203/04103; G06F 2203/04106; G06F 3/0412; G06F 3/0421; G06F 3/044; G09G 2354/00; G09G 2380/10; G09G 3/3406; H03K 17/962; H03K 2217/960785
See application file for complete search history.

(56) References Cited

U.S. PATENT DOCUMENTS

| | | |
|---|---|---|
| 2009/0174121 A1 | 7/2009 | Hayes et al. |
| 2010/0259497 A1 | 10/2010 | Livingston et al. |
| 2016/0062626 A1* | 3/2016 | Kubota ................ B60K 37/06 715/716 |
| 2016/0259365 A1* | 9/2016 | Wang .................. H05K 5/0217 |
| 2017/0277323 A1 | 9/2017 | Kim et al. |
| 2018/0022294 A1 | 1/2018 | Haas et al. |
| 2019/0020339 A1* | 1/2019 | Haslette ............... H03K 17/955 |
| 2019/0063722 A1* | 2/2019 | Sugiyama ............... B32B 21/08 |
| 2020/0241675 A1* | 7/2020 | Oki ...................... G02B 6/0091 |
| 2020/0299184 A1* | 9/2020 | Fenton .................... C03C 19/00 |
| 2021/0034100 A1* | 2/2021 | Lesuffleur .............. H01L 33/44 |

OTHER PUBLICATIONS

International Search Report and Written Opinion for International Application No. PCT/US2019/019617 dated Apr. 26, 2019, 20 pages.
Communication pursuant to Article 94(3) EPC issued for European Application No. 19757841.2 dated Jul. 20, 2023, 8 pages.

* cited by examiner

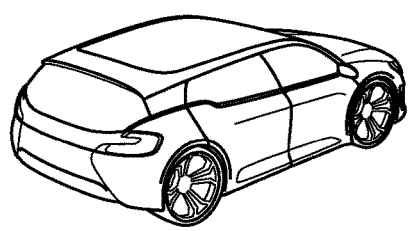
FIG. 1A
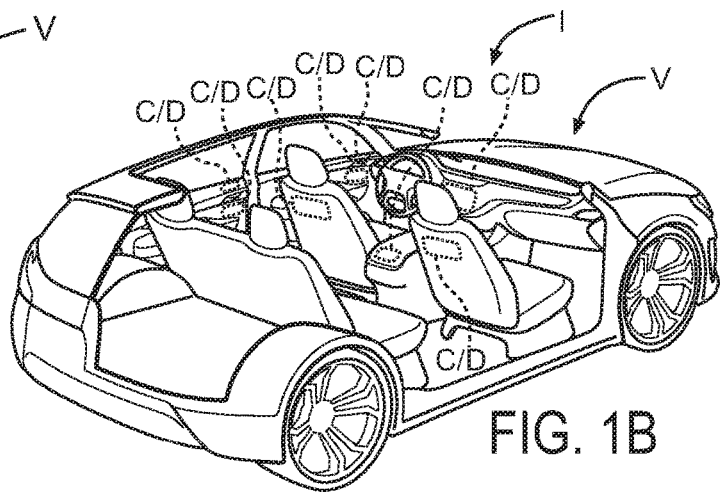
FIG. 1B
FIG. 2A
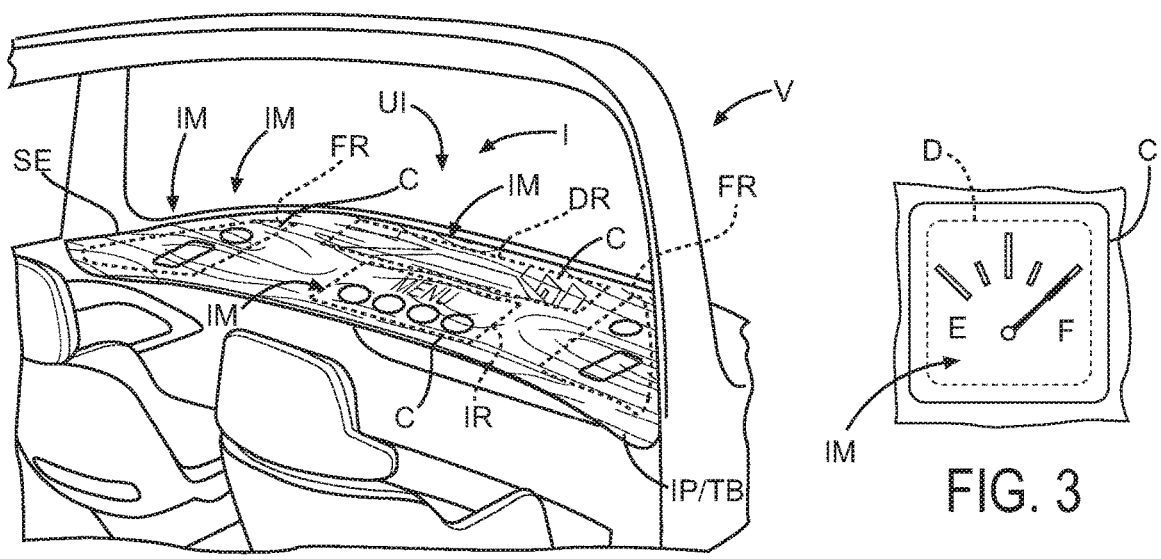
FIG. 3
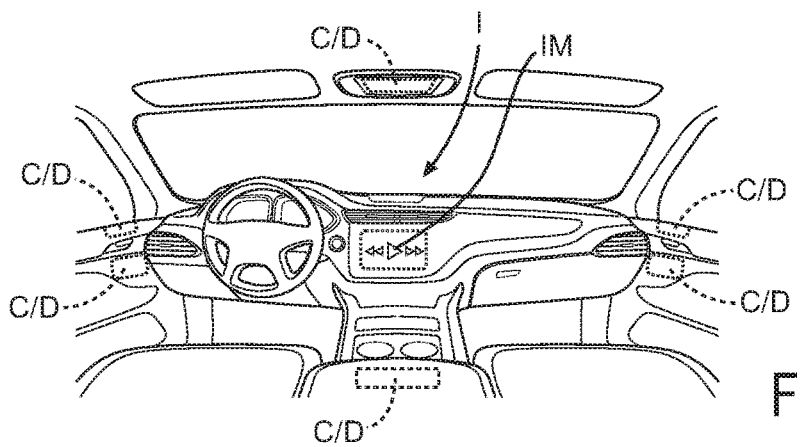
FIG. 2B

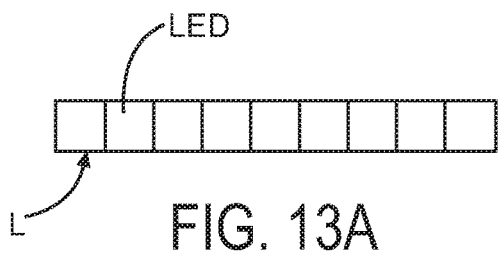
FIG. 13A
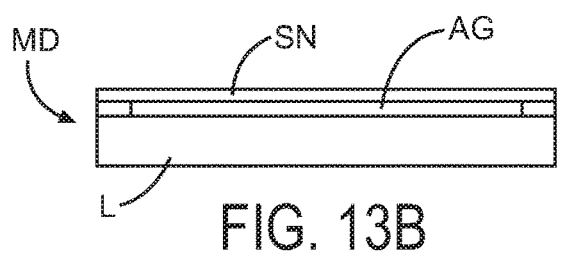
FIG. 13B
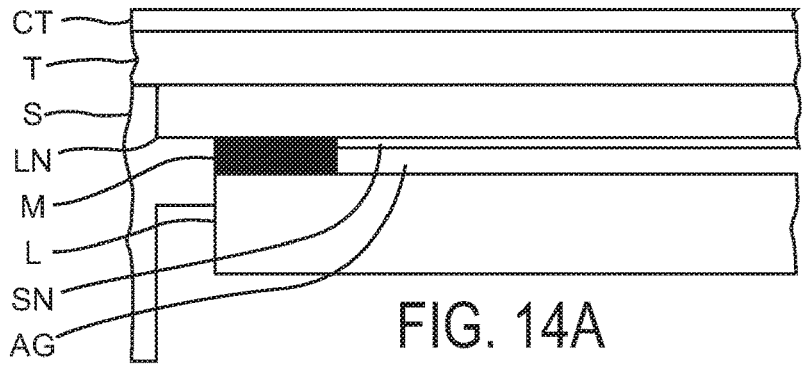
FIG. 14A
FIG. 14B
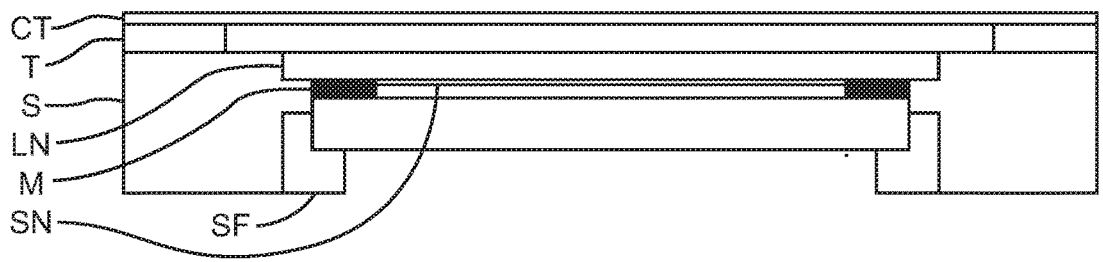
FIG. 14C
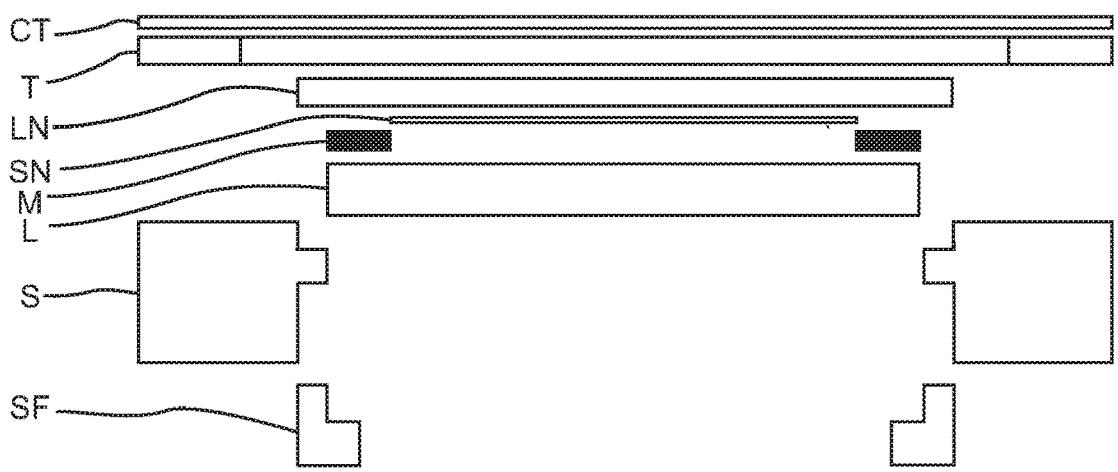

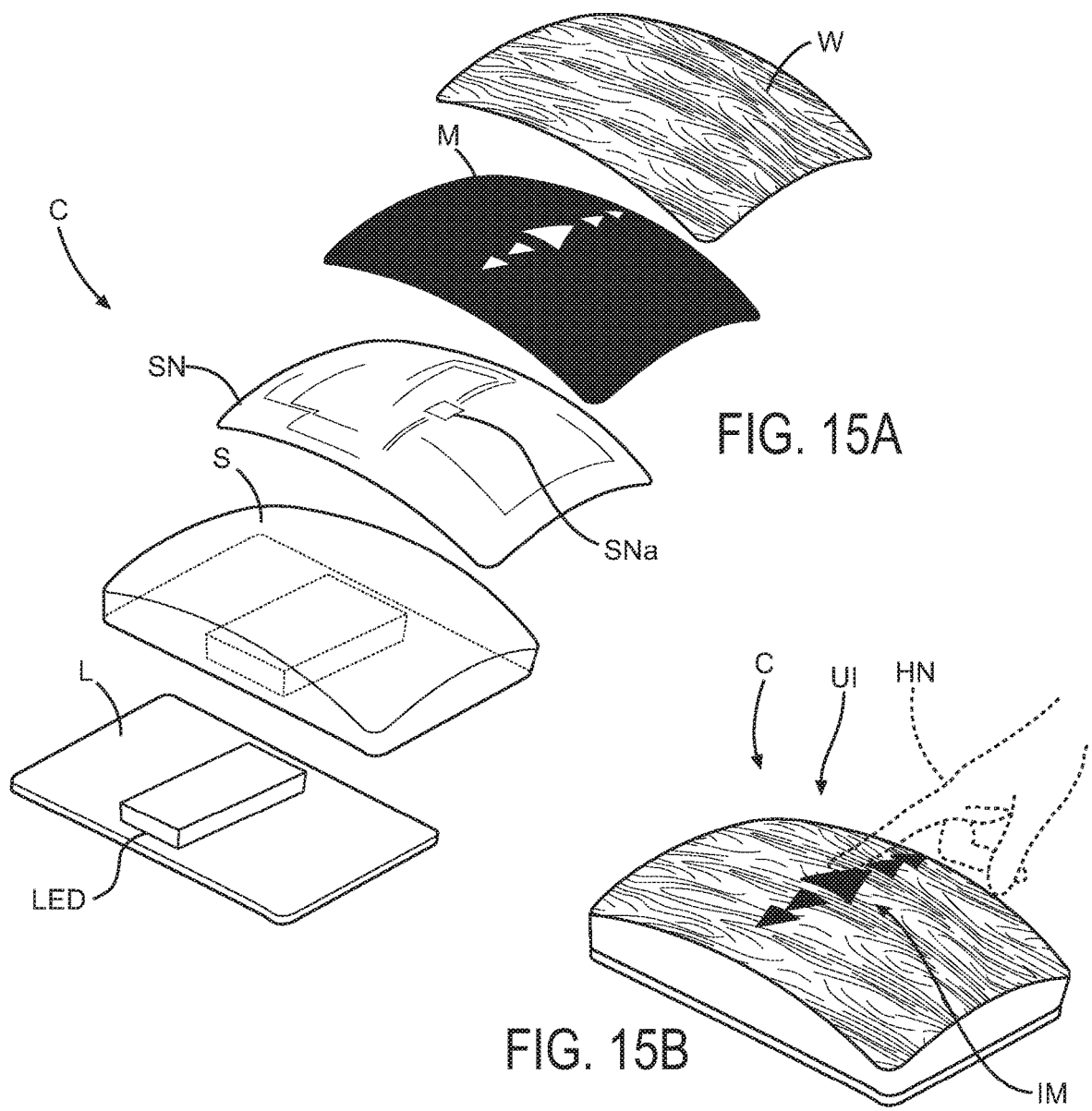
FIG. 15A
FIG. 15B
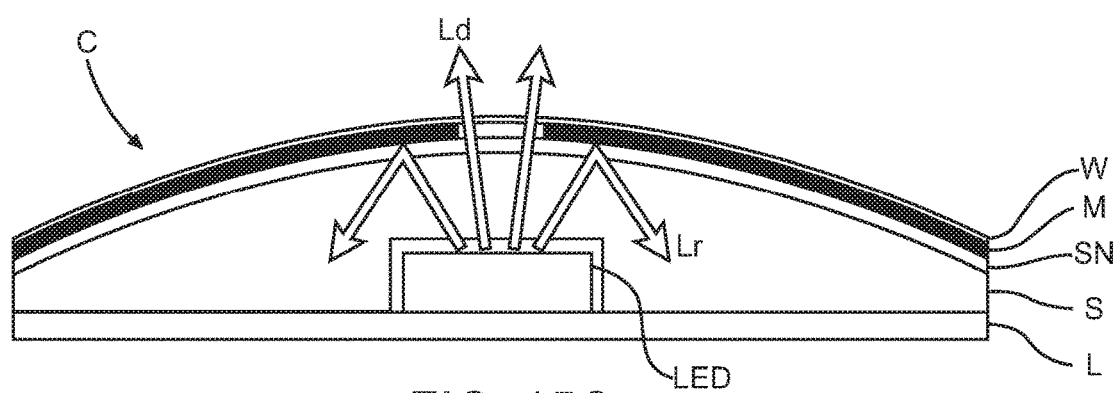
FIG. 15C

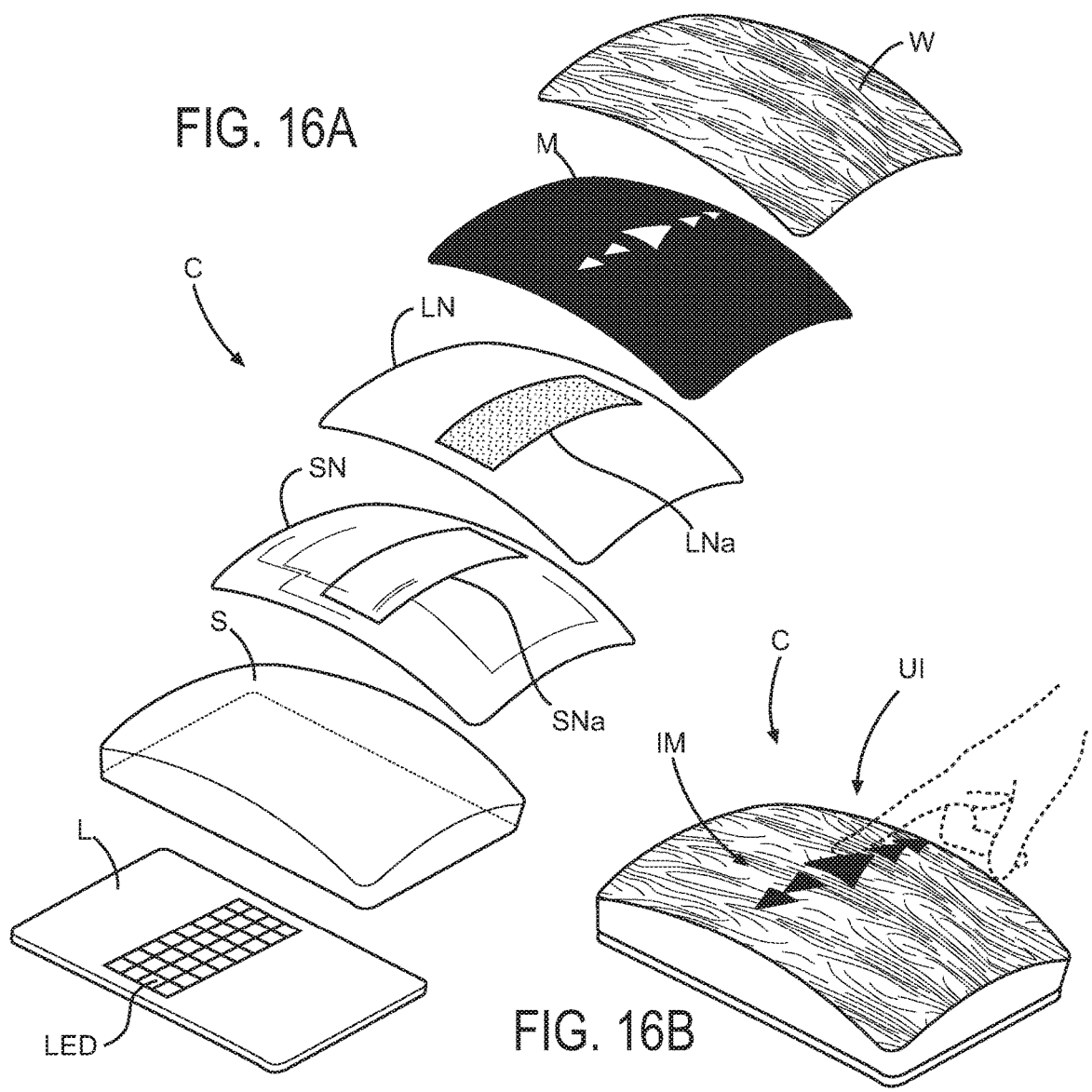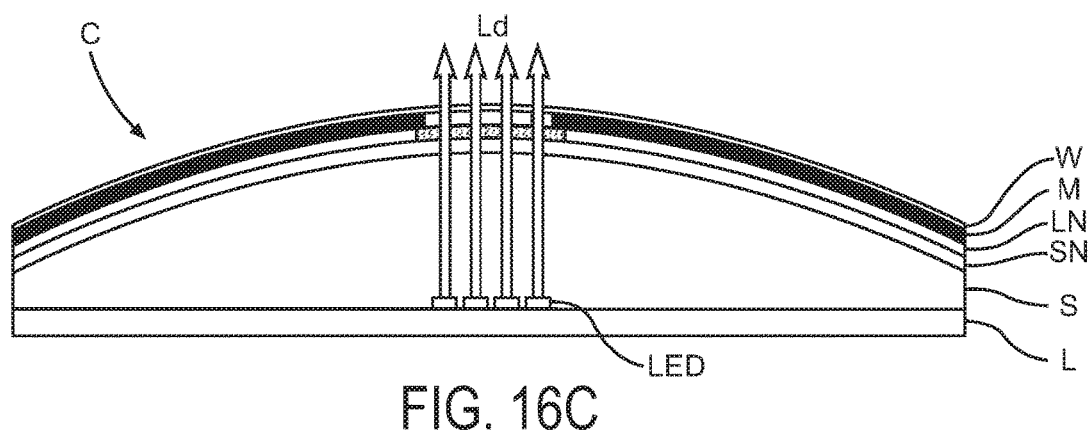

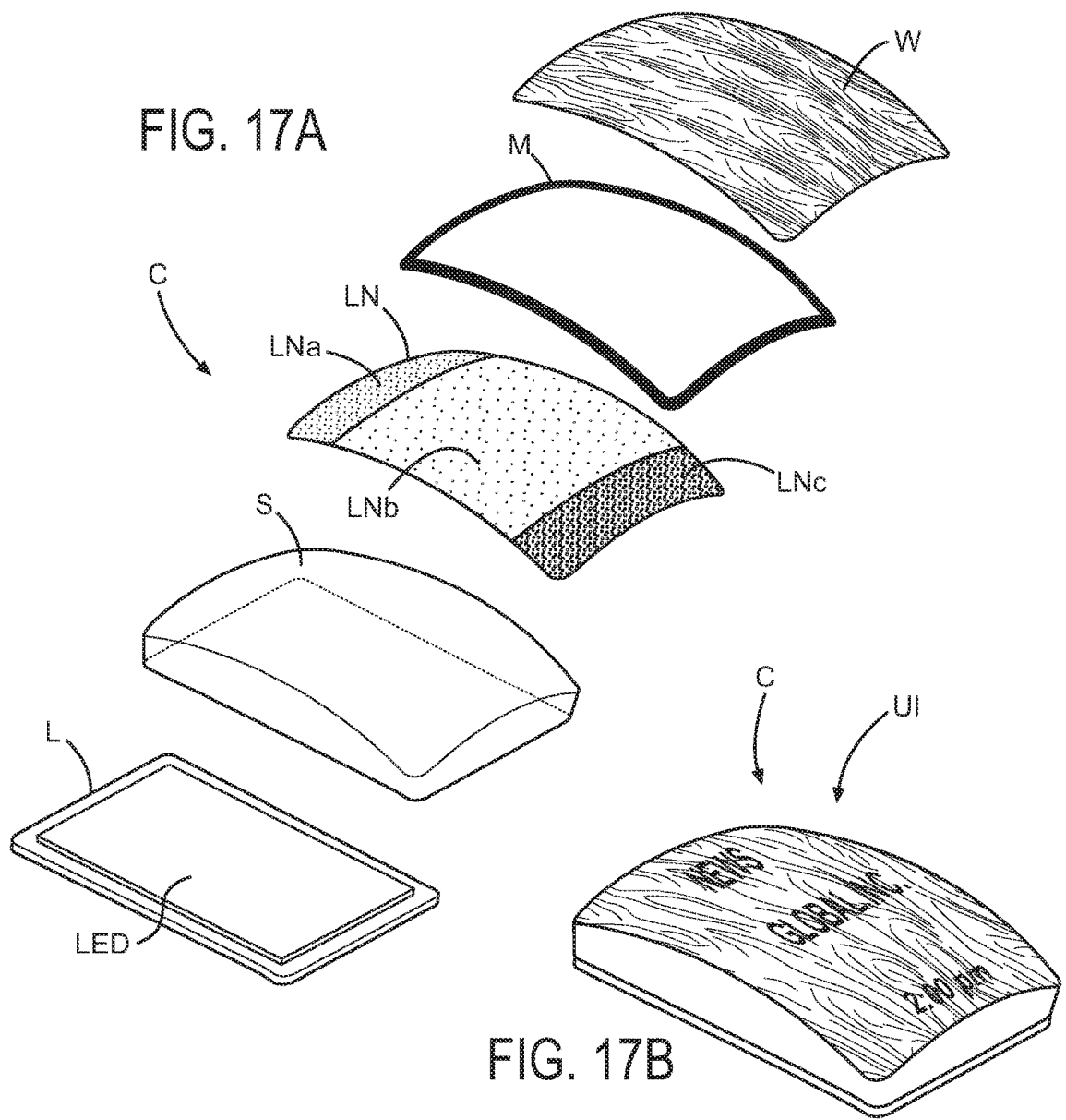
FIG. 17A
FIG. 17B
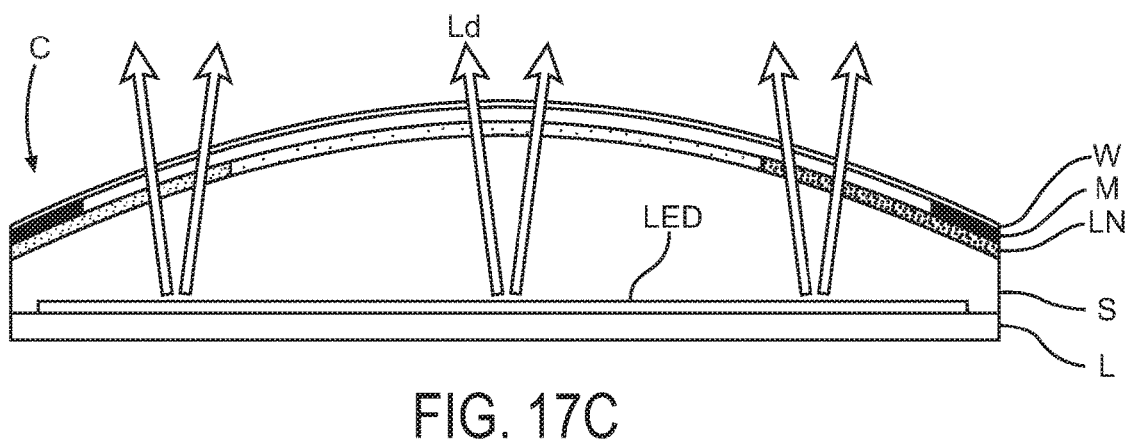
FIG. 17C

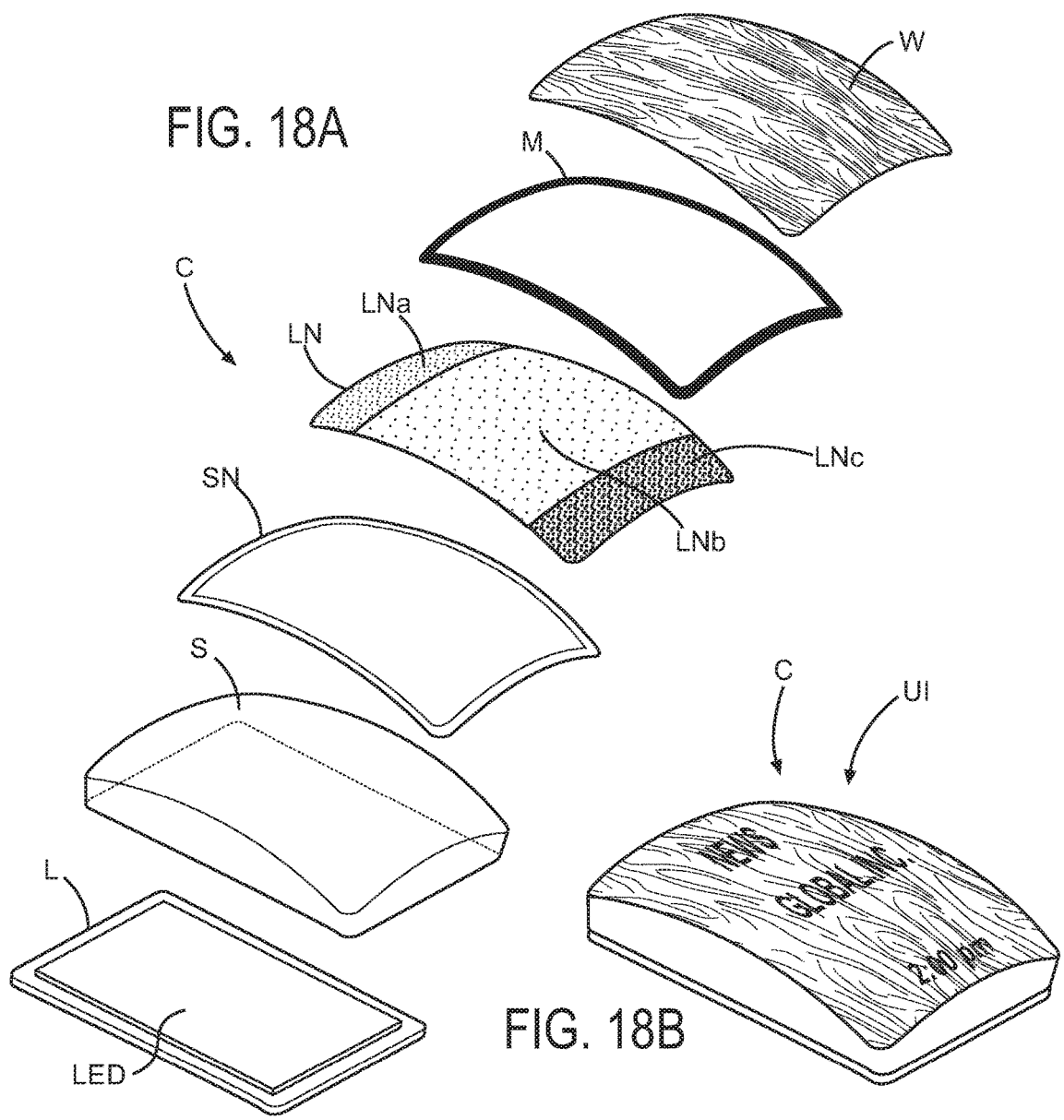
FIG. 18A
FIG. 18B
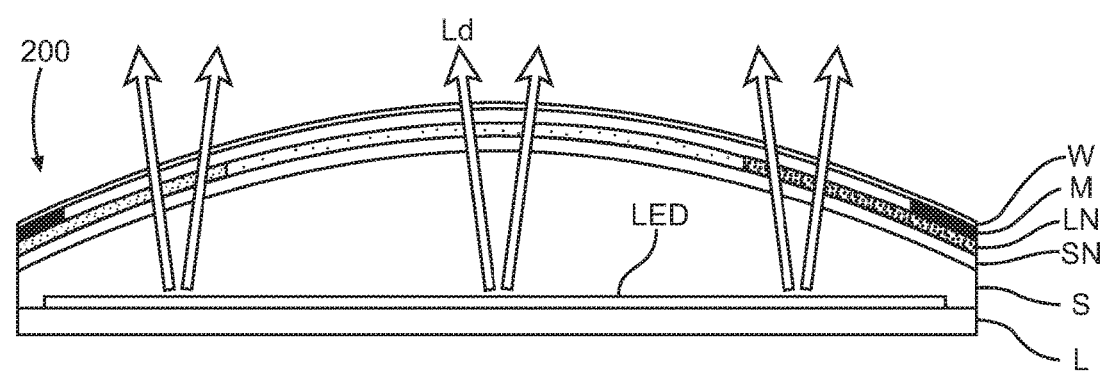
FIG. 18C

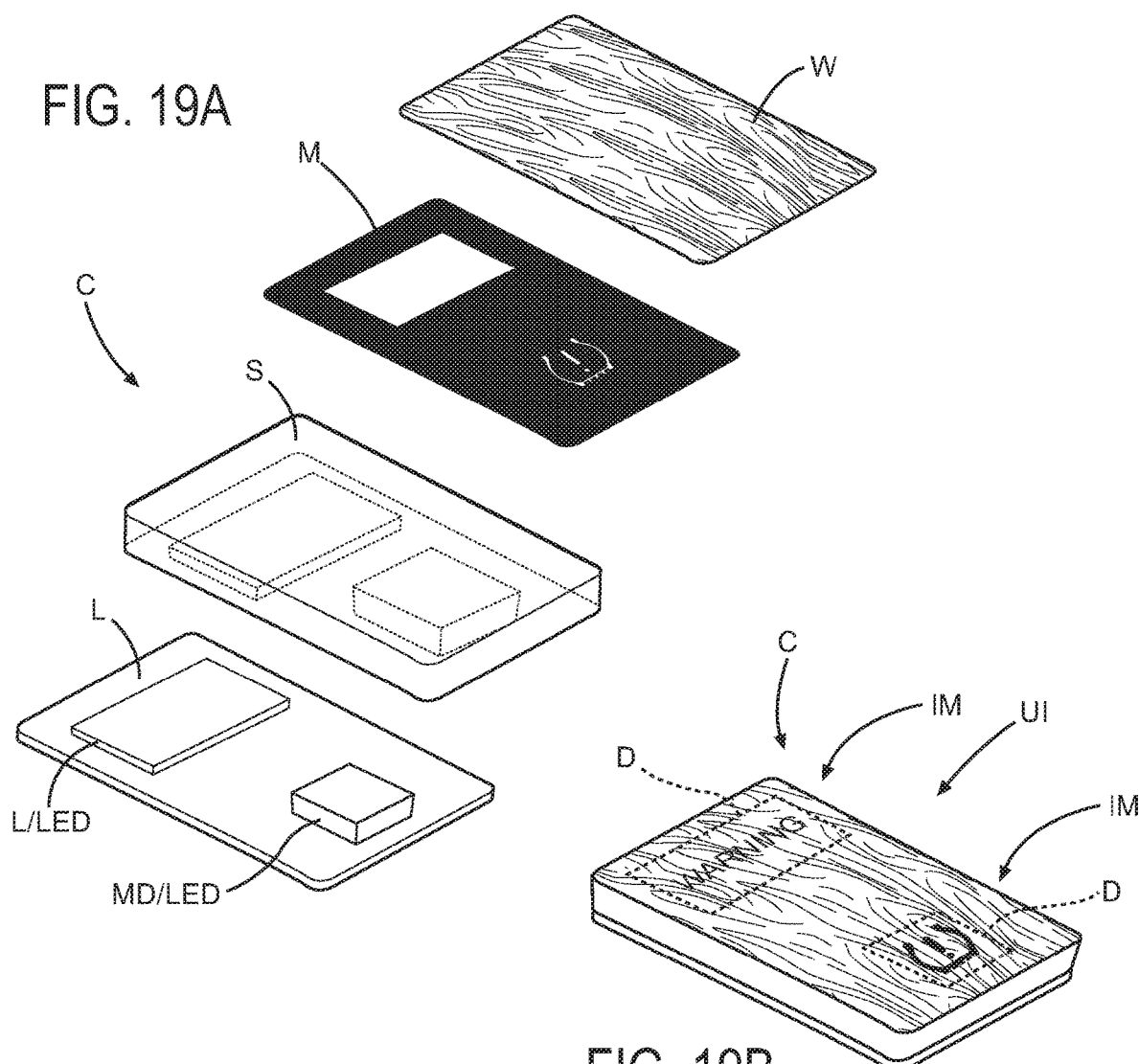
FIG. 19A
FIG. 19B
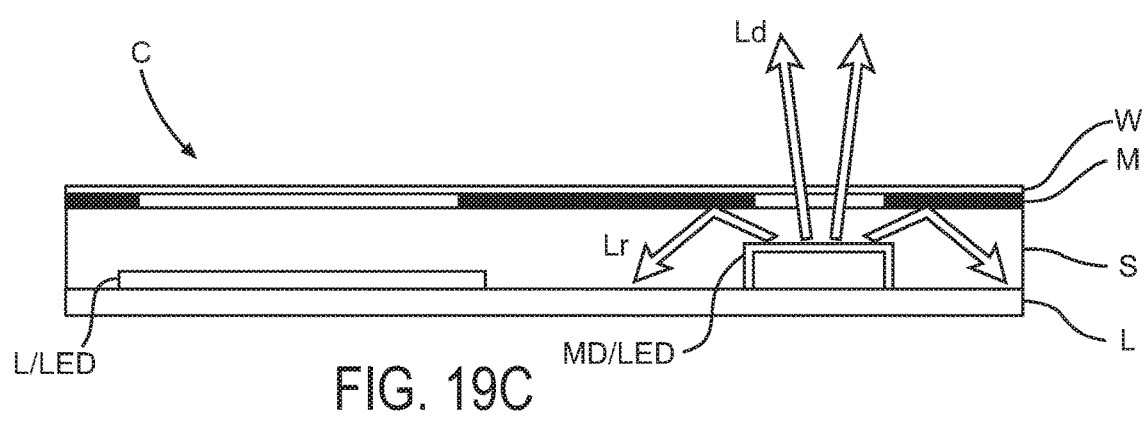
FIG. 19C

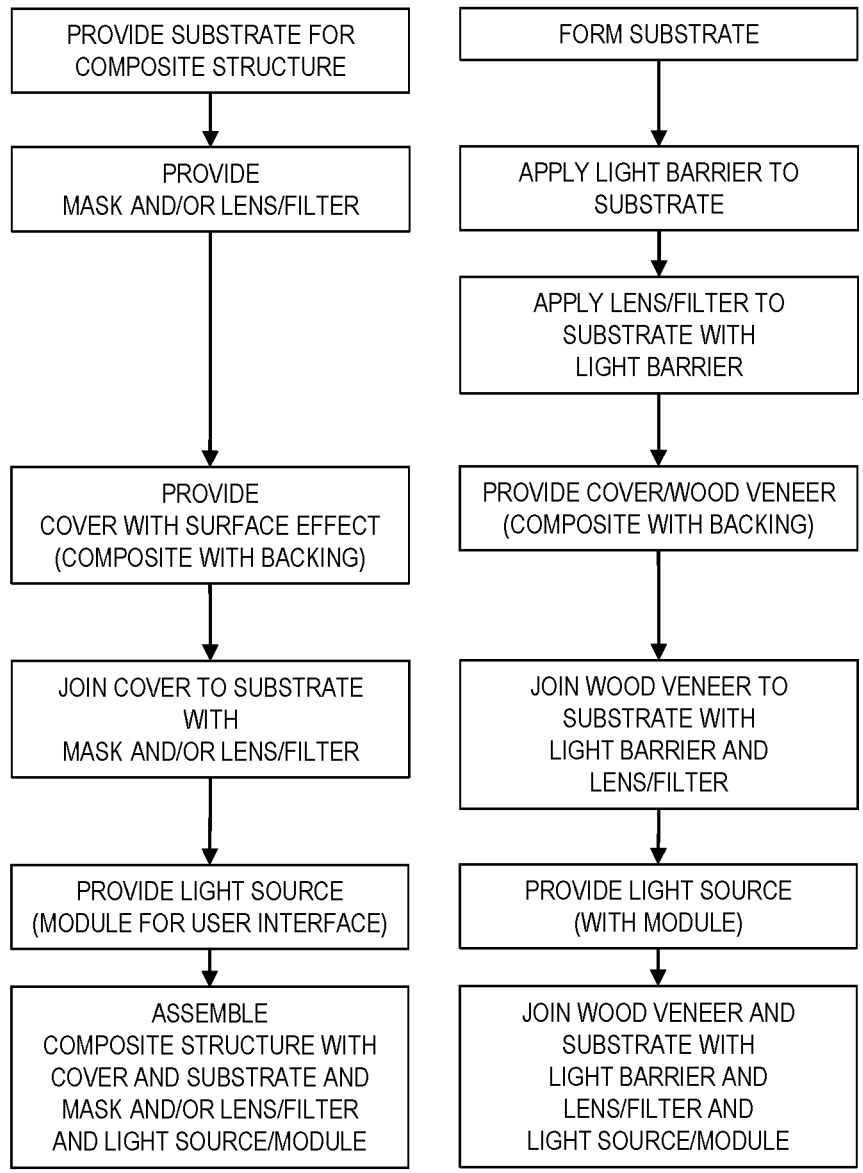

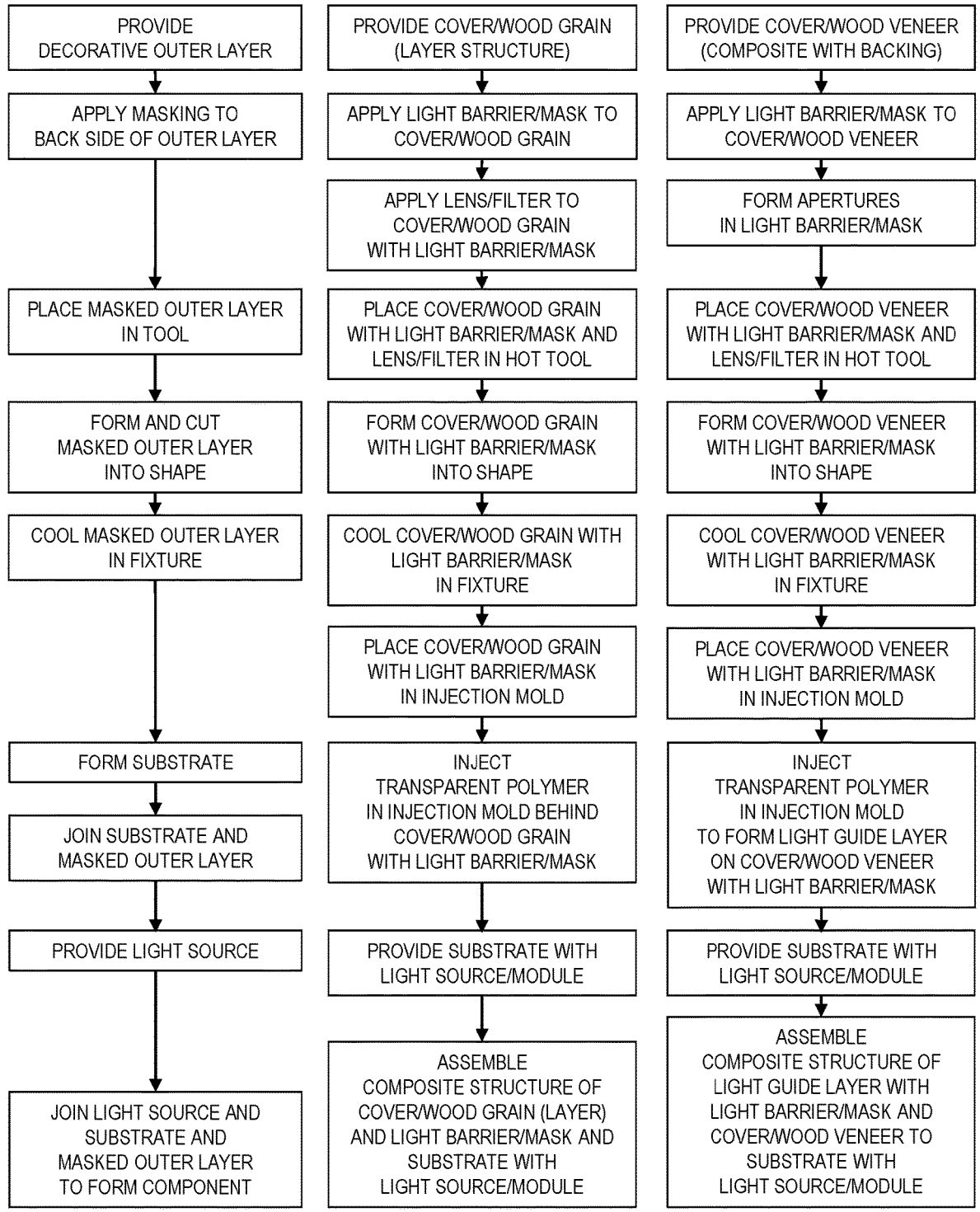

VEHICLE INTERIOR COMPONENT

CROSS-REFERENCE TO RELATED APPLICATION(S)

The present application is a continuation of PCT/International Patent Application No. PCT/US19/19617 titled "VEHICLE INTERIOR COMPONENT" filed Feb. 26, 2019, which claims the benefit of U.S. Provisional Patent Application No. 62/635,359 titled "VEHICLE INTERIOR COMPONENT" filed Feb. 26, 2018.

The present application claims priority and incorporates by reference in full the following patent applications: (a) U.S. Provisional Patent Application No. 62/635,359 titled "VEHICLE INTERIOR COMPONENT" filed Feb. 26, 2018; (b) PCT/International Patent Application No. PCT/US19/19617 titled "VEHICLE INTERIOR COMPONENT" filed Feb. 26, 2019.

FIELD

The present invention relates to a vehicle interior component.

BACKGROUND

It is known to provide a vehicle interior component providing a surface such as a wood grain or other natural material intended to have a visible surface effect.

It would be advantageous to provide an improved vehicle interior component with a surface of a material and configured with a display so that when the display is unilluminated the surface effect of the material of the surface is visible and when the display is illuminated a display of light from a light source is visible in a region at and/or on the surface.

SUMMARY

The present invention relates to a vehicle interior component configured to provide a user interface comprising a display configured to present an image when illuminated by a light source comprising a composite structure comprising a cover and a substrate. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The material of the cover may comprise a wood veneer. The composite structure may comprise a light-blocking layer; the light-blocking layer may comprise at least one of (a) a mask; (b) a mask layer. The composite structure may comprise a light-transmissive element; the light-transmissive element may comprise at least one of (a) a lens; (b) a filter; (c) a colorant. The composite structure may comprise a sensor for the user interface. The user interface may comprise image display functionality; when the image display functionality is not in operation the surface effect of the cover may be presented, and when the image display functionality is in operation the light source may be configured to provide a backlit effect for display of the image at the surface of the cover; the surface effect of the cover may be visible when the image display functionality is in operation. The composite structure may comprise a mask layer comprising a light transmissive section and a generally opaque section; the mask layer may comprise at least one of (a) an open section; (b) an image section providing at least one aperture; (c) an open section and an image section. The light-transmissive effect for the cover may comprise at least one of (a) transmission of light; (b) translucence; (c) general transparence. The component may comprise at least one of (a) a panel; (b) an instrument panel; (c) a door panel; (d) a trim panel; (e) a table; (f) a table surface; (g) a surface; (h) a console; (i) a floor console; (j) a center console; (k) an overhead console; (l) a functional surface; (m) a cover; (n) a cover for a compartment; (o) a cover for an adaptive volume compartment; (p) a receptacle; (q) a cover for a receptacle; (r) a cover for an adaptive volume receptacle; (s) a mobile device holder; (t) a cup holder; (u) a storage area; (v) a sidewall; (w) an armrest; (x) a headliner; (y) a dashboard; (z) seat trim; (aa) a steering wheel; (bb) a seat; (cc) a pillar; (dd) a roof pillar; (ee) pillar trim; (ff) an autonomous vehicle trim panel; (gg) autonomous vehicle trim; (hh) an autonomous vehicle component.

The present invention relates to a vehicle interior component configured to provide a user interface comprising a display configured to present an image when illuminated by a light source comprising a composite structure comprising a cover and a substrate. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The composite structure may comprise a light-transmissive segment. The material of the cover may comprise a wood veneer. The light-transmissive segment may comprise at least one of (a) a mask; (b) a lens; (c) a filter; (d) a colorant. The light-transmissive segment may comprise a mask; the mask may comprise an opaque section and an image section comprising at least one aperture configured to display an image when illuminated by a light source. The composite structure may comprise the cover, a backing for the cover and a mask layer; the substrate may comprise a structure for the cover and the light-transmissive segment.

The present invention relates to a vehicle interior component configured to provide a user interface comprising a display configured to present an image when illuminated by a light source comprising a composite structure comprising (a) a cover; and (b) a substrate; and (c) a module configured to provide the user interface. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The composite structure may comprise a light-transmissive segment. The surface effect of the surface of the cover may be configured to be presented as a wood texture appearance. The display may be configured to present an image at the surface of the cover when the light source is illuminated; the display may be configured for at least one of (a) to present an image; (b) to present information; (c) to present a graphic; (d) to present text; (e) to present a graphic and text; (f) to present the user interface. The image may be presented through the surface effect of the surface of the cover. The image may be projected by the light source for display at the surface of the cover. The module may comprise at least one of (a) a display panel; (b) an LED; (c) an LED array; (d) a light source; (e) a display and a sensor. The module may comprise a sensor; the sensor may comprise at least one of (a) a capacitive sensor; (b) a capacitive array; (c) a capacitive grid; (d) a proximity detector; (e) a touch sensor configured to provide the user interface; (f) a touch sensor configured to provide a proximity sensor; (g) a proximity sensor configured to detect proximity of a vehicle occupant for interaction with the user interface; (h) a proximity sensor for a compartment.

The present invention relates to a vehicle interior component configured to provide a user interface comprising a display configured to present an image when illuminated by a light source comprising a composite structure comprising a cover and a substrate. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The surface effect of the cover may comprise at least one of (a) grain texture or (b) wood texture. The material of the cover may comprise a wood veneer. The substrate may comprise a backing for the cover; the backing may comprise at least one of (a) a paper; (b) a fiber material; (c) a film; (d) a plastic film. The composite structure may further comprise a light-blocking layer. The light-blocking layer may comprise at least one of (a) a mask; (b) a mask layer. The composite structure may further comprise a light-transmissive element. The light-transmissive element may comprise at least one of (a) a lens; (b) a filter; (c) a colorant. The composite structure may further comprise a sensor for the user interface. The sensor may comprise at least one of (a) a capacitive sensor; (b) a capacitive array; (c) a capacitive grid; (d) a proximity detector. The composite structure may comprise a gap between the sensor and the light source. The light source may comprise at least one of (a) a display panel; (b) an LED; (c) an LED array; (d) a module. The module may comprise at least one of (a) an LED; (b) an LED array; (c) a display panel; (d) a sensor. The user interface may comprise image display functionality; when the image display functionality is not in operation the surface effect of the cover may be presented and when the image display functionality is in operation the light source may be configured to provide a backlit effect for display of the image at the surface of the cover. The surface effect of the cover may be visible when the image display functionality is in operation. The surface effect of the cover may comprise a wood grain appearance. When the image display functionality is not in operation the surface effect of the cover may be presented with substantially no indication of image display functionality.

The display may be configured for at least one of (a) to present an image; (b) to present information; (c) to present a graphic; (d) to present text; (e) to present a graphic and text; (f) to present the user interface. The display may be configured as at least one of (a) an information region; (b) an instrumentation region; (c) a functional region; (d) a decorative region; (e) the user interface. The composite structure may further comprise a mask layer comprising a light transmissive section and a generally opaque section. The mask layer may comprise an open section. The mask layer may comprise an image section providing at least one aperture. The mask layer may comprise an open section and an image section. The light-transmissive effect for the cover may comprise at least one of (a) transmission of light; (b) translucence; (c) general transparence. The surface effect of the cover may comprise at least one of (a) grain effect; (b) wood grain effect; (c) wood appearance effect; (d) bamboo texture effect; (e) bamboo appearance effect; (f) basswood appearance effect; (g) aspen wood texture effect. The light source may comprise at least one of (a) a module; (b) a light; (c) an LED; (d) an LED array; (e) a display panel. The light source may be configured to present a single-color display. The light source may be configured to present a multi-color display. The light source may comprise at least one of (a) a single-color LED; (b) a multi-color display; (c) a multi-color LED array; (d) a light source configured to be projected through a colorant. The light source may be configured to present a single-color display. The surface effect may be a visible surface effect in ambient conditions. The component may further comprise a cover composite comprising the cover and a backing. The backing may comprise a backing layer. The backing layer may comprise at least one of (a) a paper; (b) a film; (c) a plastic film; (d) a light-transmissive material. The component may further comprise a cover assembly comprising the cover composite comprising a veneer and a backing comprising a backing layer for the veneer. The display may comprise at least one of (a) a region; (b) a display region configured to display an image; (c) an information display region configured to display information; (d) an instrumentation region configured to display information relating to a vehicle system; (e) a decorative region configured to display a decorative image; (f) a decorative region configured to display an ornamental appearance; (g) a decorative region configured to display information; (h) a functional region configured to display an image relating to the function of a vehicle system; (i) a functional region configured to facilitate interaction with a vehicle system; (j) a functional region configured to indicate a function of a vehicle system; (k) the user interface.

The component may comprise at least one of a panel; an instrument panel; a door panel; a trim panel; a table; a table surface; a surface; a console; a floor console; a center console; an overhead console; a functional surface; a cover; a cover for a compartment; a cover for an adaptive volume compartment; a receptacle, a cover for a receptacle, a cover for an adaptive volume receptacle, a mobile device holder, a cup holder, a storage area; a sidewall, an armrest; a headliner; a dashboard; a center console; a steering wheel; a seat; seat trim; a pillar; a roof pillar; pillar trim; autonomous vehicle trim panel; autonomous vehicle trim; autonomous vehicle component.

The present invention relates to a vehicle interior component configured to provide a user interface comprising a display configured to present an image when illuminated by a light source comprising a composite structure comprising (a) a cover; (b) a substrate; and (c) a light-transmissive segment. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The light-transmissive segment may comprise at least one of (a) a mask; (b) a lens; (c) a filter; (d) a colorant. The light-transmissive segment may comprise a lens. The light-transmissive segment may comprise at least one of (a) a filter; (b) a colorant. The light-transmissive segment may comprise a mask. The mask may comprise an opaque section and an image section comprising at least one aperture configured to display an image when illuminated by a light source. The image section may comprise an opening providing a frame for display of an image from a display panel. The substrate may comprise a structure for the cover and the light-transmissive segment. The composite structure may comprise the cover; a backing for the cover; a lens. The composite structure may comprise the cover; a backing for the cover; a mask layer; and the substrate may comprise a structure for attachment to the light source. The composite structure may comprise the cover; a backing for the cover; a mask layer; a lens; an air gap above the light source.

The present invention relates to a vehicle interior component configured to provide a user interface comprising a display configured to present an image when illuminated by a light source comprising a composite structure comprising (a) a cover; (b) a substrate; and (c) a light-transmissive segment. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The light source may comprise a module configured to provide the user interface. The surface effect of the surface of the cover may be configured to be presented as a wood texture appearance. The display may be configured to present an image at the surface of the cover when the light source is illuminated. The image may be presented through the surface effect of the surface of the cover. The image may be projected by the light source for display at the surface of the cover. The light-transmissive segment may comprise at least one of (a) a lens; (b) a mask. The module may comprise at least one of (a) a display panel; (b) an LED; (c) an LED array. The module may comprise a sensor. The module may comprise a sensor and a display. The module may comprise a display panel and an LED array. The module may comprise a light source and a display panel. The module may be configured to interact with a vehicle system. The module may be configured for connection to a network. The light-transmissive segment may comprise a mask layer comprising a frame section and an image section. The user interface may be configured to present at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an interface configured as a selective information display. The composite structure may further comprise a sensor. The sensor may comprise a touch sensor configured to provide the user interface. The sensor may comprise a touch sensor configured to provide a proximity sensor. The sensor may comprise a proximity sensor configured to detect proximity of a vehicle occupant for interaction with the user interface. The sensor may comprise a proximity sensor for a compartment.

The present invention relates to a component for a vehicle interior with a surface intended to be visible to an occupant when the component is installed in the vehicle interior comprising: a base; a decorative layer coupled to the base; and a cover coupled to the decorative layer comprising an outer layer. The cover may comprise a laminate. The base may comprise a nonplanar surface and the cover may comprise an inner layer; the inner layer of the cover and the outer layer of the cover may be nonplanar. The inner layer of the cover may be configured to align with the nonplanar surface of the base. The decorative layer may comprise at least one of a foil or a film. The decorative layer may be laminated to the base. The component may further comprise an adhesive configured to couple the decorative layer to the cover. The adhesive may be configured to transmit light passing from the cover to the decorative layer. The cover may comprise a wood veneer. The cover may comprise plastic wood laminate. The decorative layer may comprise at least a portion configured to prevent visibility of the base. The decorative layer may comprise at least one of (a) ink (b) paint (c) a foil (d) a film configured to prevent illumination to pass from a display to the cover. The decorative layer may comprise at least a portion configured to allow illumination to pass from a display to the cover. The component may comprise a sensing layer; the sensing layer may comprise at least one of (a) an electrical circuit; (b) a sensor; (c) a capacitive switch; (d) a capacitive switch sensor. The decorative layer may comprise an opening; the opening may be configured to at least one of (a) expose the base; (b) uncover the base. The decorative layer may be configured to provide a visual effect; the cover may be configured to provide a visual effect; the visual effect of the decorative layer and the visual effect of the cover may be configured to provide a composite visual effect.

The present invention relates to a component for a vehicle interior providing a composite visual effect comprising: a base; a decorative layer providing a visual effect and coupled to the base; and a cover providing a visual effect, the cover coupled over the decorative layer. The composite visual effect may be provided by the visual effect of the decorative layer and the visual effect of the cover. The base may comprise a nonplanar surface and the cover may comprise an inner surface and an outer surface; the inner surface of the cover and the outer surface of the cover may be nonplanar. The inner surface of the cover may be configured to align with the nonplanar surface of the base. The cover may comprise at least one of (a) wood; (b) plastic wood veneer; (c) artificial wood. The cover may comprise a nonplanar form. The decorative layer may be laminated to the base. The decorative layer may comprise at least one of (a) a sheet; (b) a foil; (c) a film. The component may further comprise an adhesive configured to couple the decorative layer to the cover. The adhesive may be configured to transmit light from the cover to the decorative layer. The visual effect of the cover may comprise at least one of: (a) wood; (b) wood grain. The visual effect of the decorative layer may comprise at least one of: (a) wood; (b) wood grain. The visual effect of the cover may comprise a transition between two visual effects. The cover may further comprise a film; the film may comprise at least a portion configured to absorb light from a display.

The present invention relates to a component for a vehicle interior configured to be illuminated by a light source and with a surface intended to be visible to an occupant when the component is installed in the vehicle interior comprising: a cover; a layer coupled to the cover; and a base. The cover may comprise at least one of wood or wood grain. The component may further comprise a sensor layer comprising at least one of (a) an electrical circuit; (b) a sensor; (c) a capacitive sensor; (d) a capacitive switch; (e) a sensor; (l) an array; (g) a grid; (h) a panel; (i) a film; (j) a foil. The cover may be configured to be backlit by the light source. The surface intended to be visible to an occupant may comprise a continuous wood surface when not illuminated by the light source. The surface intended to be visible to an occupant may comprise at least one of (a) an icon; (b) a decorative element; (c) a graphic; (d) an indicator; (e) an animated effect; (f) a graphical element when illuminated by the light source. The light source may comprise at least one of (a) an LED; (b) a light changing LED; (c) a light guide; (d) a fiber optic patch. The layer may comprise a decorative layer. The layer may comprise at least one of (a) a light blocking material; (b) paint; (c) a film; (d) a decal; (e) a foil; (f) an applique. The layer may comprise a mask. The layer may comprise at least one of (a) a window; (b) an aperture; (c) an opening configured to allow illumination to pass from the light source to the cover.

The present invention relates to a method of manufacturing a vehicle trim component comprising the steps of providing a base; joining a decorative layer to the base to create a decorative base; and joining a cover to the decorative layer. At least a portion of the decorative layer may be configured to allow illumination to pass from the cover to the base. The decorative layer may comprise at least one of (a) ink (b) paint (c) a foil (d) a film. At least a portion of the decorative layer may be configured to transmit light passing from a light source to the cover. At least a portion of the decorative layer may be configured to prevent transmission of light passing from the cover to the base. The method may comprise the step of joining at least one of (a) an electrical circuit; (b) a sensor; (c) a capacitive switch; (d) a capacitive switch sensor to at least one of the decorative layers; the base. Joining the cover to the decorative layer may comprise applying an adhesive to at least one of (a) the cover; (b) the decorative layer; the adhesive may be configured to allow illumination to pass from the cover to the decorative base.

The present invention relates to. a vehicle interior component comprising a composite structure comprising a surface/cover providing a surface effect and configured to be illuminated in a region such as an information/instrumentation region, a decorative region and/or a functional region by a light source/module so that the surface effect of the surface will be visible (e.g. predominantly visible as a standard surface/cover without other substantial indication) when the light/source module is unilluminated and a display of an image will be visible (e.g. image displayed with appropriate intensity/clarity) through the surface effect of the surface when the light/source module is illuminated.

The component may be configured for any of a wide variety of vehicles (including but not limited to driver vehicles, autonomous vehicles, etc.) and may comprise at least one of a panel; an instrument panel; a door panel; a trim panel; a table; a table surface; a surface; a console; a floor console; a center console; an overhead console; a functional surface; a cover; a cover for a compartment; a cover for an adaptive volume compartment; a receptacle, a cover for a receptacle, a cover for an adaptive volume receptacle, a mobile device holder, a cup holder, a storage area; a sidewall, an armrest; a headliner; a dashboard; a center console; a steering wheel; a seat; seat trim; a pillar; a roof pillar; pillar trim; autonomous vehicle trim panel; autonomous vehicle trim; autonomous vehicle component, etc.

FIGURES

FIG. 1A is a schematic perspective view of a vehicle according to an exemplary embodiment.

FIG. 1B is a schematic perspective cut-away view of a vehicle showing an interior with vehicle interior components according to an exemplary embodiment.

FIGS. 2A and 2B are schematic perspective cut-away views of an interior of a vehicle according to an exemplary embodiment.

FIG. 3 is a schematic view of a display for a vehicle interior component according to an exemplary embodiment.

FIG. 6C is a schematic view of a display for a vehicle interior component according to an exemplary embodiment.

FIGS. 13A and 13B are schematic section views of a light source/module for a display for a vehicle interior component according to an exemplary embodiment.

FIG. 14A is a schematic fragmentary section view of a display for a vehicle interior component according to an exemplary embodiment.

FIG. 14B is a schematic section view of a display for a vehicle interior component according to an exemplary embodiment.

FIG. 14C is a schematic exploded section view of a display for a vehicle interior component according to an exemplary embodiment.

FIG. 15A is a schematic exploded perspective view of a vehicle interior component providing a display according to an exemplary embodiment.

FIG. 15B is a schematic perspective view of a vehicle interior component providing a display according to an exemplary embodiment.

FIG. 15C is a schematic section view of a vehicle interior component providing a display according to an exemplary embodiment.

FIG. 16A is a schematic exploded perspective view of a vehicle interior component providing a display according to an exemplary embodiment.

FIG. 16B is a schematic perspective view of a vehicle interior component providing a display according to an exemplary embodiment.

FIG. 16C is a schematic section view of a vehicle interior component providing a display according to an exemplary embodiment.

FIG. 17A is a schematic exploded perspective view of a vehicle interior component providing a display according to an exemplary embodiment.

FIG. 17B is a schematic perspective view of a vehicle interior component providing a display according to an exemplary embodiment.

FIG. 17C is a schematic section view of a vehicle interior component providing a display according to an exemplary embodiment.

FIG. 18A is a schematic exploded perspective view of a vehicle interior component providing a display according to an exemplary embodiment.

FIG. 18B is a schematic perspective view of a vehicle interior component providing a display according to an exemplary embodiment.

FIG. 18C is a schematic section view of a vehicle interior component providing a display according to an exemplary embodiment.

FIG. 19A is a schematic exploded perspective view of a vehicle interior component providing a display according to an exemplary embodiment.

FIG. 19B is a schematic perspective view of a vehicle interior component providing a display according to an exemplary embodiment.

FIG. 19C is a schematic section view of a vehicle interior component providing a display according to an exemplary embodiment.

FIG. 20 is a schematic flow diagram of a method of producing a vehicle interior component providing a display according to an exemplary embodiment.

FIG. 21 is a schematic flow diagram of a method of producing a vehicle interior component providing a display according to an exemplary embodiment.

FIG. 22 is a schematic flow diagram of a method of producing a vehicle interior component providing a display according to an exemplary embodiment.

FIG. 23 is a schematic flow diagram of a method of producing a vehicle interior component providing a display according to an exemplary embodiment.

FIG. 24 is a schematic flow diagram of a method of producing a vehicle interior component providing a display according to an exemplary embodiment.

DESCRIPTION

Referring to FIGS. 1A and 1B a vehicle V providing an interior I is shown according to an exemplary embodiment. The interior I of the vehicle V comprises interior components/systems including panels (e.g. instrument panel, door panels, etc.) and consoles (e.g. floor console, overhead console, etc.) and other trim components. See also FIGS. 2A-2B, 5A-5C and 6A.

According to an exemplary embodiment as shown schematically in FIGS. 1B and 2A-2B, the interior of the vehicle may comprise one or multiple components C configured to provide a user interface/system UI such as through a display D configured to display an image IM (e.g. data, information, instrumentation, communications, notifications, text, graphics, icons, controls, network/internet-based media, decorative effects, etc.). See also FIG. 3 (e.g. image IM on display D of component C shown as information/instrumentation for a vehicle system indicated as a fuel level indicator). As shown schematically in FIG. 2A, the component C providing the display D for the user interface system UI comprise a surface/panel shown as table IP/TB providing a cover with surface providing a surface effect SE (e.g. texture, color, contour, visual effect, image display, etc.); as shown schematically according to an exemplary in FIG. 2A, the panel IP/TB may comprise a surface effect SE such as wood trim/grain (e.g. wood veneer, finish, trim, texture, etc.); as indicated schematically according to an exemplary embodiment in FIGS. 2B and 3, the component C providing display D for the user interface may comprise a surface effect such as formed/molded contour (e.g. with visual/texture effect such as plastic, metallic, natural materials, etc.).

As shown schematically in FIGS. 2A and 3, the display D may be configured to provide at least one of an information/instrumentation region IR, a functional region FR and/or a decorative/display region DR; each region of the display may present a user interface UI for interaction of a vehicle occupant (e.g. interaction with a vehicle system, information interchange, control/monitoring, etc.). See also FIGS. 4A-4B, 5A-5D, 7, 8A-8C, 10A-10D, 12A-12C, 15A-15C and 19A-19C.

As indicated schematically in FIGS. 1B and 2A-2B, the component/display C/D may be provided on a panel, an instrument panel, a door panel, a table, a table surface, a console, a floor console, a center console, a functional surface, a cover, a cover for a compartment, a cover for an adaptive volume compartment; at least one of a trim panel; an armrest; a headliner; a dashboard; a console; a center console; a door panel; a steering wheel; a seat; a pillar, a roof pillar, pillar trim, etc. See also FIGS. 2A, 3, 4A-4B, 5A-5D, 7, 8A-8C, 10A-10D, 12A-12C, 15A-15C and 19A-19C.

Figure 4A:
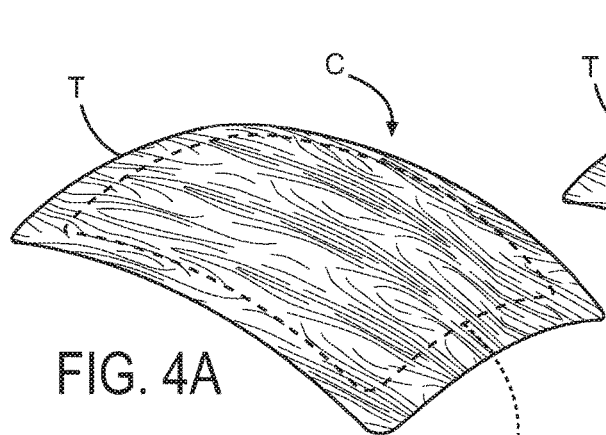
FIGS. 4A and 4B are schematic perspective views of a vehicle interior component providing a display according to an exemplary embodiment.
Figure 4B:
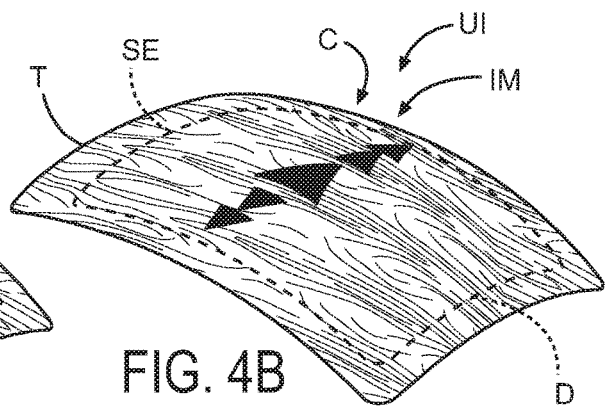

As indicated schematically according to an exemplary embodiment in FIGS. 4A-4B, the vehicle interior component may comprise a composite structure C comprising a surface/cover T providing a surface effect SE and configured to be illuminated in a display/region D (e.g. such as an information/instrumentation region, a decorative region and/or a functional region) by a light source/module so that the surface effect of the surface will be visible (e.g. predominantly visible as a standard surface/cover without other substantial indication) when the light/source module is uni-lluminated (see FIG. 4A) and a display of an image IM will be visible (e.g. image displayed with appropriate intensity/clarity) through the surface effect of the surface when the light/source module is illuminated (see FIG. 4B). As indicated schematically in FIGS. 4A-4B, when in operation the user interface UI is provided as an image IM presented at the display D of the component C through the surface effect SE of the cover/surface T; when not in operation the image of the user interface/display is absent and the surface effect SE of the cover/surface T is visible (e.g. predominantly visible without substantial indication of the presence of the display/system).

Figure 5A:
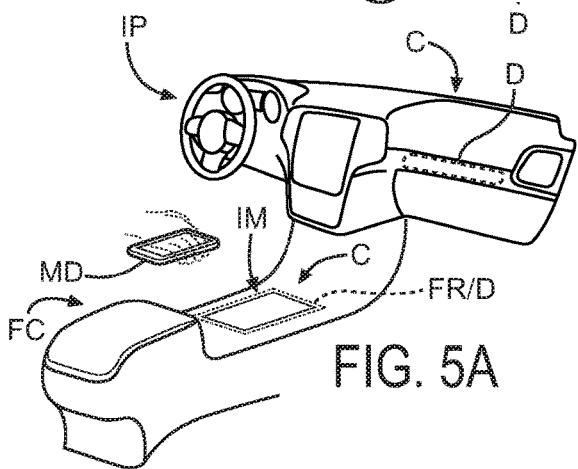
FIGS. 5A to 5C are schematic perspective views of a vehicle interior component providing a display according to an exemplary embodiment.
Figure 5D:
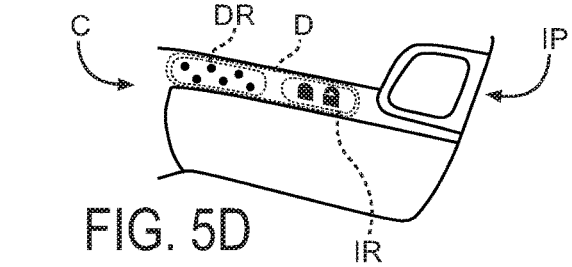
FIG. 5D is a schematic view of a display for a vehicle interior component according to an exemplary embodiment.
Figure 5C:
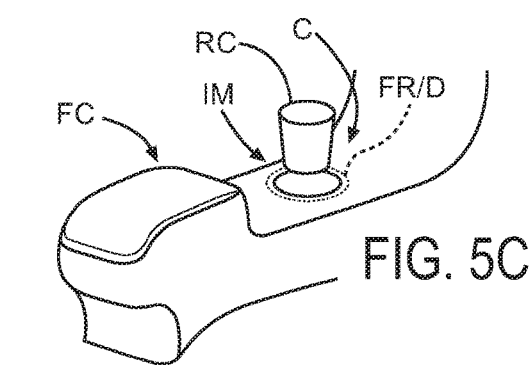
Figure 5B:
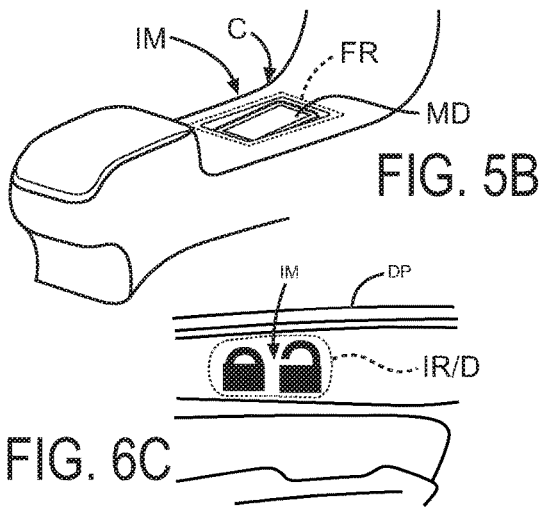

As indicated schematically according to an exemplary embodiment in FIGS. 5A-5D, the component C may be configured to provide a display D for a panel/system such as an instrument panel IP and/or for a structure/system such as floor console FC. As indicated in FIGS. 5A-5C, for a structure such as a console FC the user interface/system may provide a display for a functional region FR/D shown as a holder/receptacle for a mobile device MD with illuminated display/image IM (e.g. illuminated frame) to indicate location (see FIGS. 5A-5B) or shown as a holder/receptacle for a beverage container RC with illuminated display/image IM (e.g. illuminated ring) to indicate location (see FIG. 5C). As indicated in FIGS. 5A and 5D, for a panel such as an instrument panel IP the user interface/system may provide a display D for a decorative region DR shown as a decorative/graphic image and/or for an information/instrumentation region IR shown as an indicator for a vehicle system (e.g. status indicator such as for door lock condition/status). As indicated schematically in FIGS. 5A-5D, a light source such as a module may be configured to provide illumination for the user interface/display at the component. See generally FIGS. 12A-12C and 19A-19C (showing light source such as LED array or module as configured to provide a back-light effect for illumination of the display).

Figure 6A:
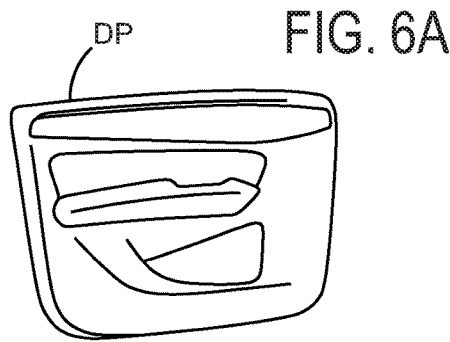
FIGS. 6A and 6B are schematic perspective views of a vehicle interior component providing a display according to an exemplary embodiment.
Figure 6B:
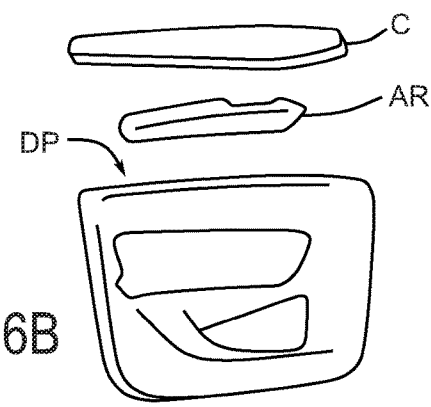
Figure 7:
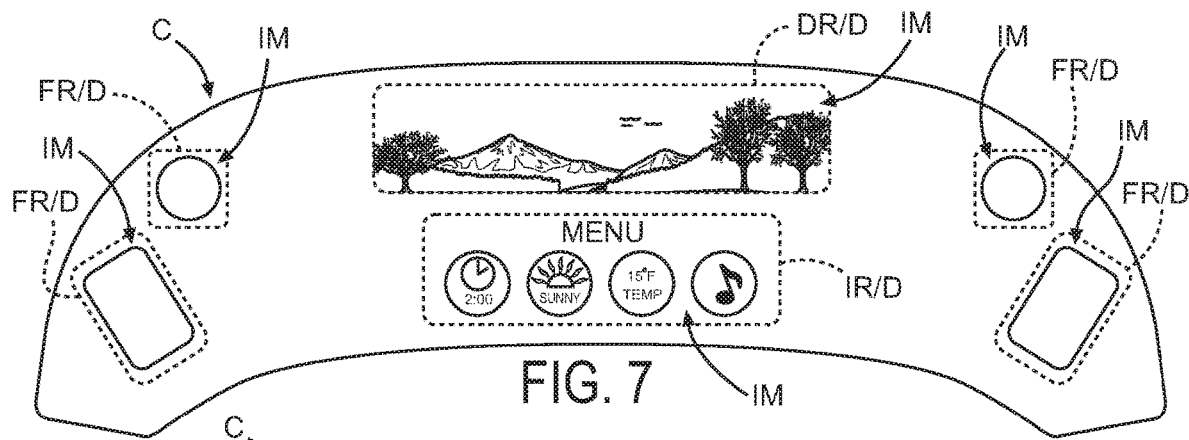
FIG. 7 is a schematic plan view of a vehicle interior component providing a display according to an exemplary embodiment.

As indicated schematically in FIGS. 6A-6C, the component C may be configured to provide a display for a panel/system such as a door panel DP with associated trim such as armrest AR to provide a user interface/system with an image IM in a region shown as information/instrumentation region IR/D (e.g. a status indicator such as for door lock condition/status); according to an exemplary embodiment the trim part/component may be configured as any of a variety of other interior trim components for a vehicle (including a decorative trim component/product). See FIGS. 1B and 2A-2B.

Figure 8A:
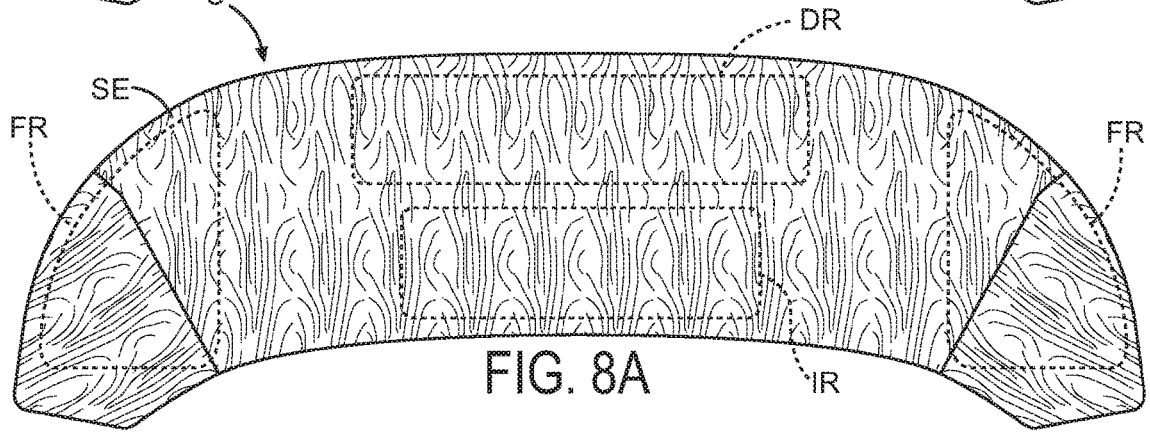
FIGS. 8A and 8B are a schematic plan views of a vehicle interior component providing a display according to an exemplary embodiment.
Figure 8C:
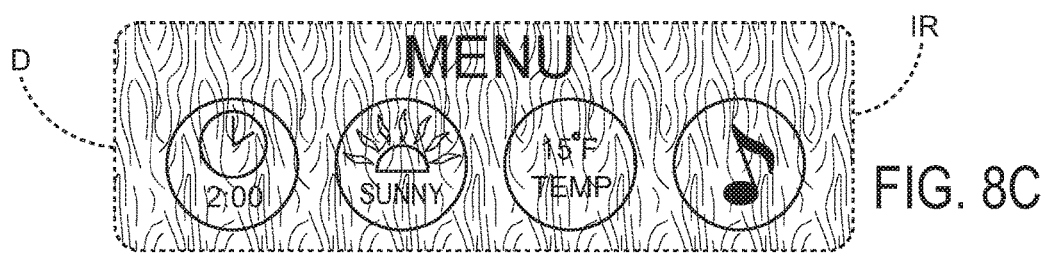
FIG. 8C is a schematic plan view of a display for vehicle interior component according to an exemplary embodiment.
Figure 8B:
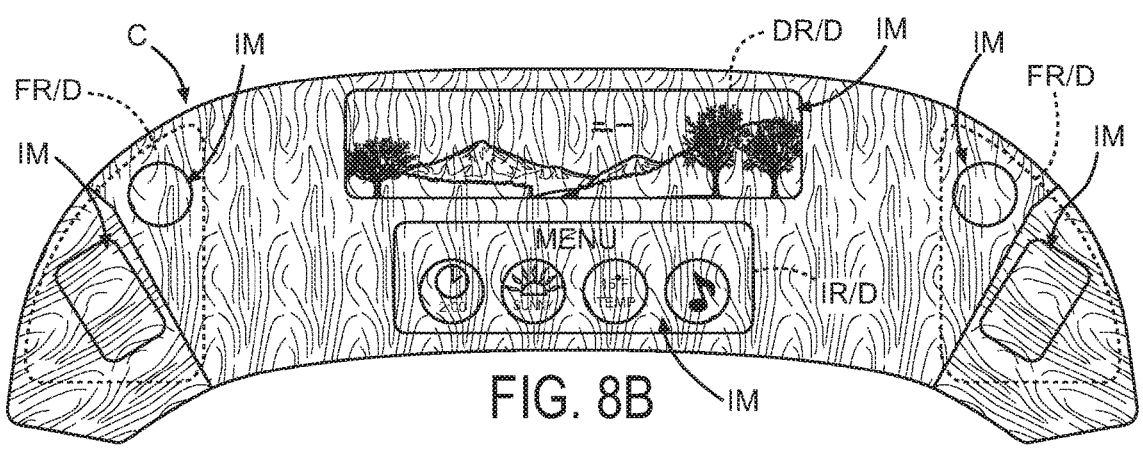
Figure 9:
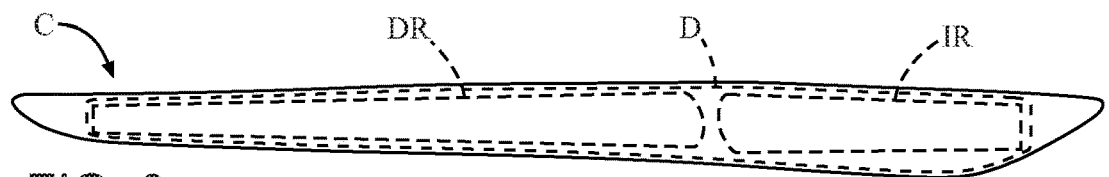
FIG. 9 is a schematic plan view of a vehicle interior component providing a display according to an exemplary embodiment.

As shown schematically in FIGS. 2A, 7 and 8A-8C, the component with display may be configured for implementation in a surface with surface effect SE shown as table/panel C; the component C may comprise a user interface/system configured for presentation of an image/display in an information/instrumentation region IR/D and an functional region FR/D and a decorative/media display region DR/D; each region may be configured for display of an image IM such as a instrumentation from a network/media or vehicle systems in instrumentation region IR/D (e.g. time, weather, music, vehicle information, etc. as indicate in FIG. 8C) and a graphic/decorative and/or purposeful information in a decorative region DR/D (e.g. camera view, ornamental/artistic image, etc.) and an informative/locating graphic in a functional region FR/D (e.g. indicating where to place an item such as a mobile device or cup for a holder/receptacle). See FIGS. 7 and 8B. As shown in FIGS. 8A and 8B, the surface effect of the panel (shown as wood grain/texture) is visible when the user interface system/display (e.g. image display functionality) is off (see FIG. 8A); an image IM is displayed selectively at each region when the user interface system/display (e.g. image display functionality) is on (see FIG. 8B). See also FIGS. 7 and 8C. As indicated in FIG. 8A, unless/until illuminated by the light source (e.g. until back-lit from the light source) the panel/trim component may present the surface effect (without an image).

Figure 10A:
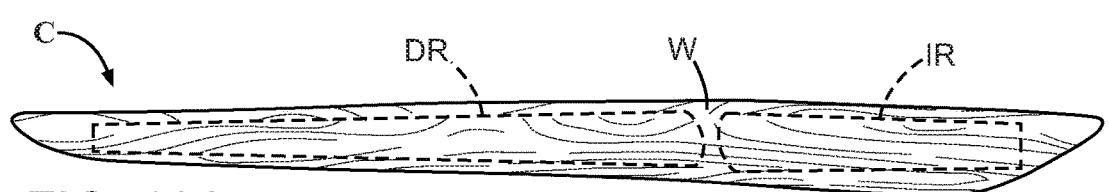
FIGS. 10A and 10B are a schematic plan views of a vehicle interior component providing a display according to an exemplary embodiment.
Figure 10C:
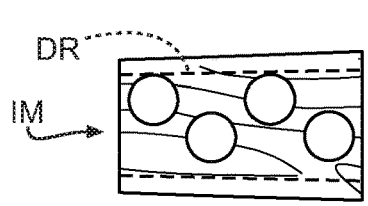
FIGS. 10C and 10D are schematic plan views of a display for vehicle interior component according to an exemplary embodiment.
Figure 10D:
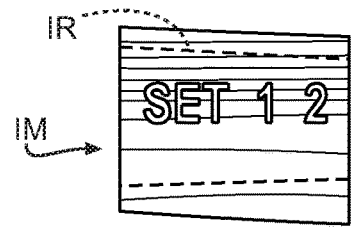
Figure 10B:
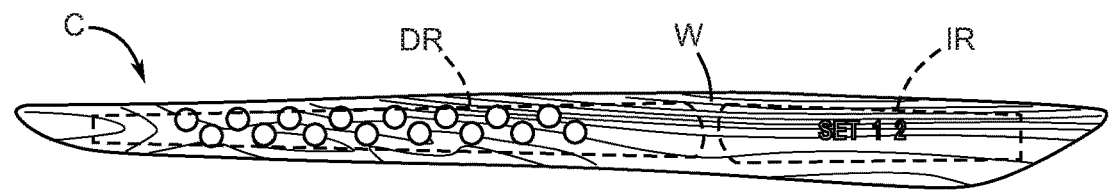
Figure 11:
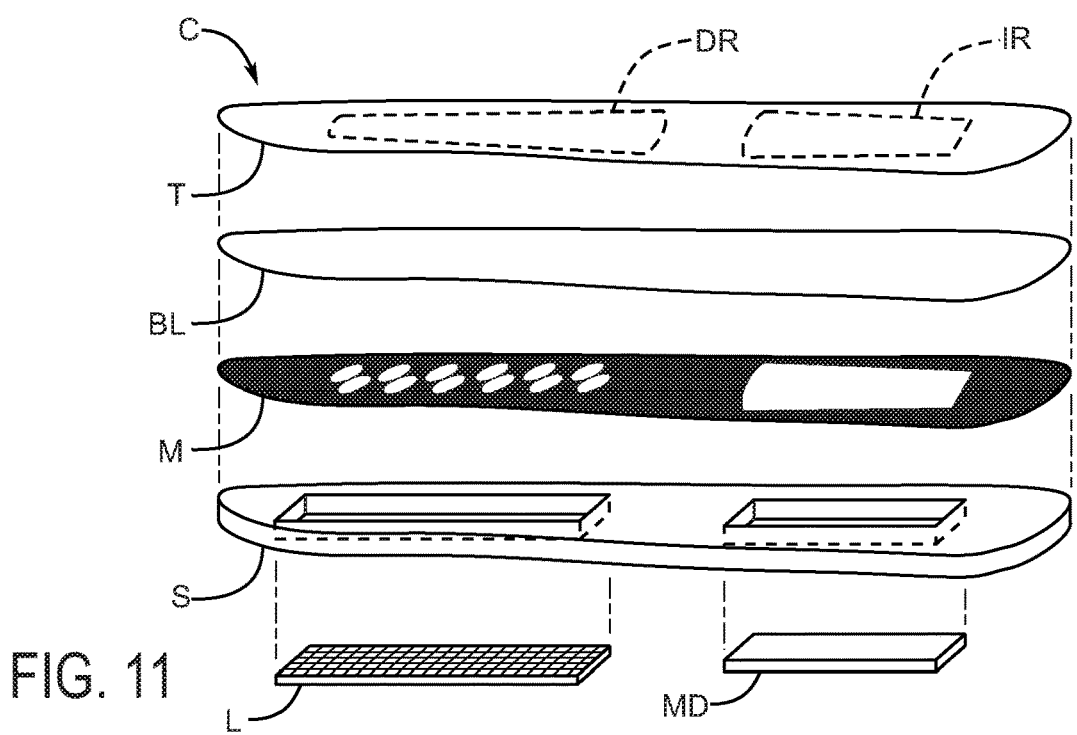
FIG. 11 is a schematic exploded perspective view of a vehicle interior component providing a display according to an exemplary embodiment.
Figure 12A:
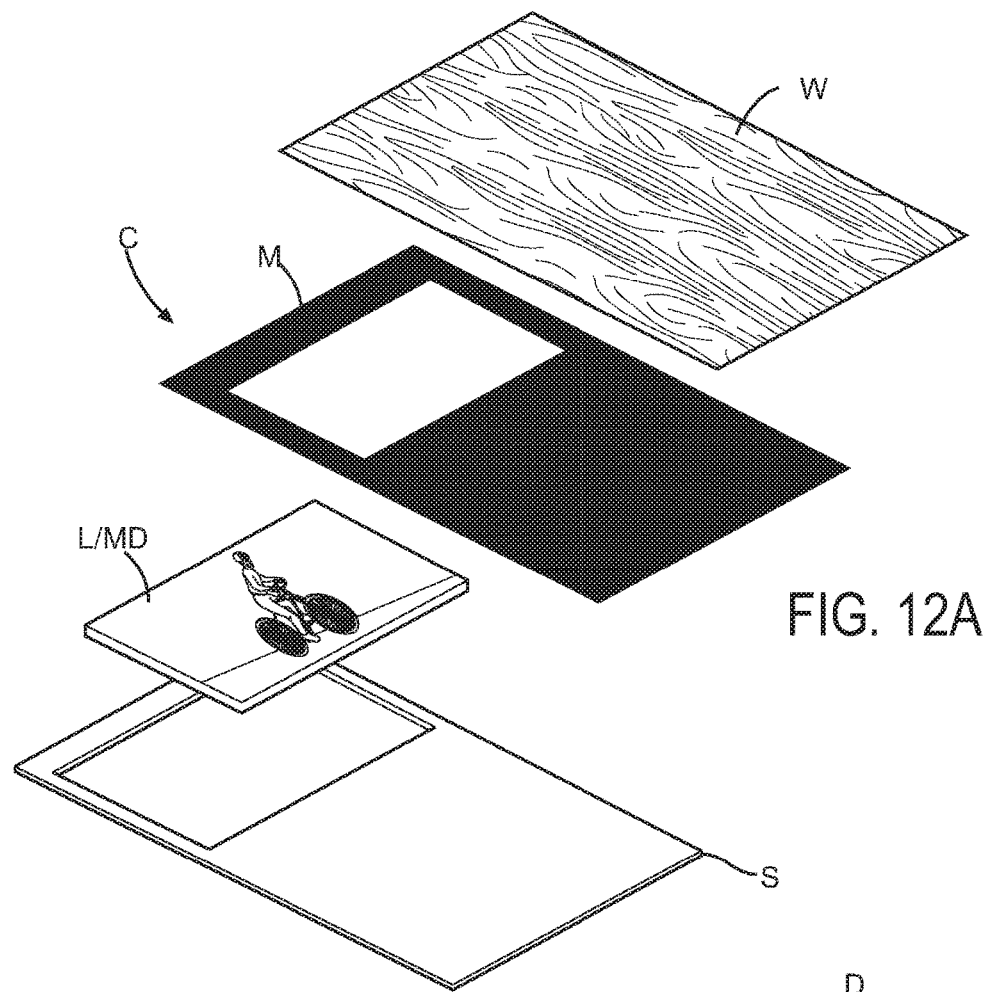
FIG. 12A is a schematic exploded perspective view of a vehicle interior component providing a display according to an exemplary embodiment.
Figure 12B:
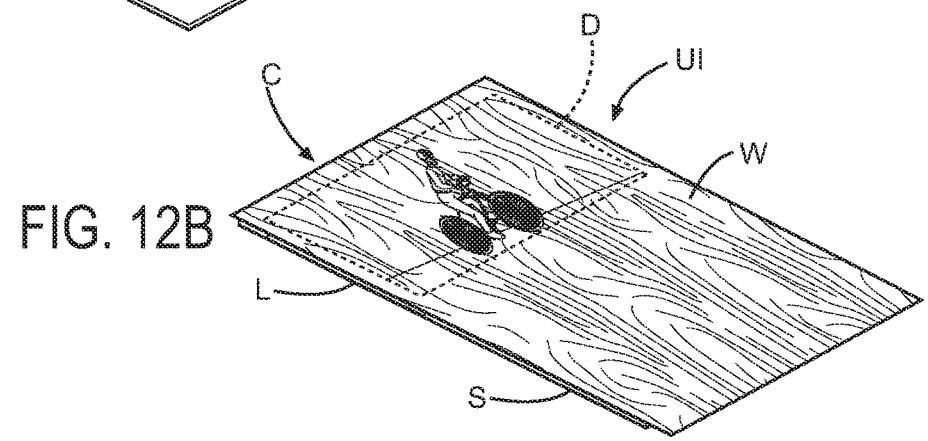
FIG. 12B is a schematic perspective view of a vehicle interior component providing a display according to an exemplary embodiment.
Figure 12C:
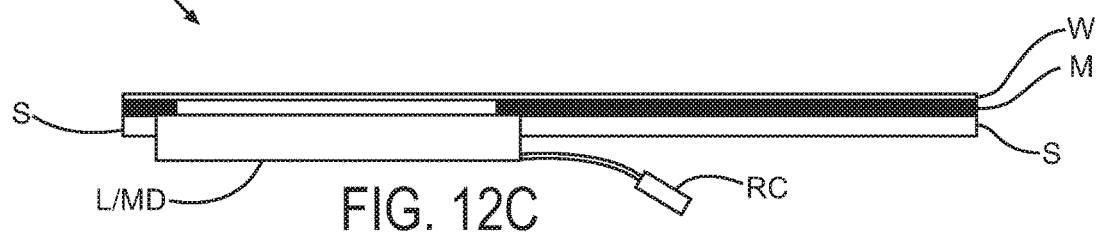
FIG. 12C is a schematic section view of a vehicle interior component providing a display according to an exemplary embodiment.

As indicated schematically according to an exemplary embodiment in FIGS. 9 and 10A-10D, a component C shown as a trim component (e.g. for a door panel) may comprise the user interface system/display. See also FIGS. 6A-6C. As indicated schematically in FIGS. 9 and 10A, until illumination is provided the component C is configured to present the general appearance of the cover/surface (e.g. wood veneer/surface W as the surface effect); as indicated schematically in FIGS. 10B and 10C-10D, when illumination is provided (e.g. from light source L and/or module MD through the substrate/surface S to the cover/surface T) the component C is configured to present through the surface effect an intended visible effect shown as an image IM (e.g. illuminated image visible through/at/on the surface) in a decorative region DR (e.g. ornamental pattern) and in an information/instrumentation region IR (e.g. an information display such as setting for a vehicle system). See also FIG. 11. As indicated schematically in FIG. 11, the component may comprise a composite structure with the cover T and a backing layer BL (e.g. forming a light-transmitting composite) and a mask layer M (e.g. providing the ornamental effect for the decorative region DR as indicated in FIGS. 10B and 10C and the frame for display of information in the instrumentation region IR as indicated in FIGS. 10B and 10D) and a substrate/structure S configured to retain/secure the light source shown as LED array L and as module M (e.g. which may comprise an integrated light source/display panel and sensor/touch screen interface).

As shown schematically in FIGS. 4A-4B through 11 and 12A-12C through 19A-19C, the user interface system/display may be implemented in a variety of forms for a vehicle interior component.

As shown schematically in FIGS. 12A-12C and 13A-13B, the user interface system UI/display D may be implemented as composite structure providing a substantially flat panel assembly C with a cover/wood texture W and a mask layer M with a window/cutout and a light source shown as display module L/MD and a substrate/structure S; connectivity may be provided to the system by a connector shown as ribbon connector RC. As shown schematically in FIG. 12B, the light source shown as display module L/MD (indicated as an LED array in FIG. 13A and as a display panel in FIG. 13B) may be configured to present an image from the display/light source through the mask layer M and visible through the surface effect (e.g. wood grain/texture) of the cover W for the user interface.

As shown schematically in FIGS. 14A-14C, the composite structure may comprise a coating CT (which may be applied as a film, paint, spray, etc.) over the cover T (which may comprise a backing layer and/or segments or sections) with a lens LN (which may comprise a filter and/or colorant) over a sensor grid SN (which may comprise a capacitive mat) and an air gap AG over the light source L (which may comprise an LED array, display panel, etc.) with a substrate S configured to provide a retaining structure (which may comprise fitting sections SF) for the composite structure.

As shown schematically in FIGS. 15A-15C, the user interface system UI/display D may be implemented as composite structure providing a curved panel assembly C with a cover providing a wood appearance/texture W and a mask layer M with an image cutout (with the image display) and a sensor assembly shown as grid SN with element SNa (e.g. touch sensor/proximity detector) and a light source shown as module LED (e.g. LED array/module) in a substrate/structure S. As shown schematically in FIG. 15B-15C, the light source shown as LED module is configured to project light that will comprise light Ld transmitted through the layers of the composite structure to the display to present image IM on the surface to provide the user interface UI (e.g. with display and touch sensor) and light Lr which is blocked from mask layer M. The LED module is configured as the light source to transmit light through the graphic/image on mask M to present the graphic/image form as illuminated by the display/light source through the mask layer M to be visible through the surface effect (e.g. wood grain/texture) of the cover W of the composite structure for the user interface system. See FIG. 15B.

As shown schematically in FIGS. 16A-16C, the user interface system UI/display D may be implemented as composite structure providing a curved panel assembly C with a cover providing a wood appearance/texture W and a mask layer M with an image cutout (with the image display) and a lens arrangement LN with a filter/color segment LNa and a sensor assembly shown as grid SN with element SNa (e.g. touch sensor foil) and a light source shown as module LED (e.g. LED array/module) with a substrate/structure S. As shown schematically in FIG. 16B-16C, the light source shown as LED module is configured to project light that will comprise light Ld transmitted through the layers of the composite structure including the sensor foil SN and lens LN to the display to present image IM on the surface to provide the user interface UI (e.g. with display and touch sensor); the LED module is configured as the light source to transmit light through the graphic/image on mask M to present the graphic/image form as illuminated by the display/light source through the mask layer M to be visible through the surface effect (e.g. wood grain/texture) of the cover W of the composite structure for the user interface system. See FIG. 16B.

As shown schematically in FIGS. 17A-17C, the user interface system UI/display D may be implemented as composite structure providing a curved panel assembly C with a cover providing a wood appearance/texture W and a mask layer M with a frame cutout (for image from the display/panel) and a lens arrangement LN with a filter/color segments LNa/LNb/LNc and a light source shown as module LED (e.g. LED array/module) with a substrate/structure S. As shown schematically in FIG. 17B-17C, the light source shown as LED module is configured as a display panel to project an image that will comprise light Ld transmitted through the layers of the composite structure including lens LN (with filter/coloration from each segment LNa/LNb/LNc) to the display to present image IM on the surface to provide the user interface UI (e.g. with display); the LED module is configured as the light source/display panel to transmit light to present the image for the display through the opening of mask M and through lens LN (with filter/coloration from each segment LNa/LNb/LNc at each corresponding section) to be visible through the surface effect (e.g. wood grain/texture) of the cover W of the composite structure for the user interface system UI. See FIG. 17B.

As shown schematically in FIGS. 18A-18C, the user interface system UI/display D may be implemented as composite structure providing a curved panel assembly C with a cover providing a wood appearance/texture W and a mask layer M with a frame cutout (for image from the display panel) and a lens arrangement LN with a filter/color segments LNa/LNb/LNc and a sensor assembly shown as grid SN with element SNa (e.g. touch sensor foil) and a light source shown as module LED (e.g. LED array/module) with a substrate/structure S. As shown schematically in FIG. 18B-18C, the light source shown as LED module is configured as a display panel to project an image that will comprise light Ld transmitted through the layers of the composite structure including lens LN (with filter/coloration from each segment LNa/LNb/LNc) to the display to present image IM on the surface to provide the user interface UI (e.g. with display and touch sensor); the LED module is configured as the light source/display panel to transmit light to present the image for the display through the opening of mask M and through lens LN (with filter/coloration from each segment LNa/LNb/LNc at each corresponding section) and through sensor foil/grid SN to be visible through the surface effect (e.g. wood grain/texture) of the cover W of the composite structure for the user interface system UI. See FIG. 18B.

As shown schematically in FIGS. 19A-19C, the user interface system UI/display D may be implemented as composite structure providing a generally flat/planar panel assembly C with a cover providing a wood appearance/texture W and a mask layer M with an image cutout (for the image display) and a corresponding light source shown as module L/LED (e.g. LED array/module configured as a display panel) and an opening cutout (for image display) and a corresponding a light source shown as module MD/LED (e.g. LED array configured as a backlight) with a substrate/structure S. As shown schematically in FIG. 19B-19C, the light source shown as L/LED module is configured as a display panel to project an image through the layers of the composite structure to the display to present image IM on the surface to provide the user interface UI (e.g. image from display panel through the opening in mask M), the light source shown as MD/LED module is configured as a backlight to project light that will comprise light Ld transmitted through the layers of the composite structure to the display to present image IM on the surface to provide the user interface UI (e.g. the graphic/image on mask M) and light Lr which is blocked from mask layer M. See FIG. 19B.

As shown schematically, the composite structure may provide the surface/cover T as a composite with backing (e.g. of a material such as paper, film, foil, fiber, sheet material, etc.) and a substrate as may be formed by injection molding (e.g. of a transparent material, etc.); the cover may comprise wood veneer W to provide the surface effect (e.g. wood trim/grain); the surface of the product P is configured to be illuminated (e.g. from light source L/backlight and/or display panel below substrate) through the wood trim cover W and backing to present the image, ornamental/visual effect or information/display (e.g. illuminated form when illuminated from the light source L/MD) on the wood trim/grain surface W; the back-lit decorative trim component product is configured to present the general appearance of the wood veneer/surface W (including in the display region DR/IR/FR) and when illumination is provided (e.g. from light source L) the back-lit decorative trim component is configured to present an intended image/display visible effect the wood veneer/surface W.

Method/Process of Assembly

Referring to FIGS. 20 through 24, a method/process of assembly of the vehicle interior component providing the display is shown schematically according to an exemplary embodiment.

As shown schematically in FIG. 20, the method/process may comprise the steps of providing substrate for composite structure; providing mask and/or lens/filter; providing cover with surface effect (composite with backing); joining cover to substrate with mask and/or lens/filter; providing light source (module for user interface); assembling composite structure with cover and substrate and mask and/or lens/filter and light source/module.

As shown schematically in FIG. 21, the method/process may comprise the steps of forming a substrate, applying a light barrier to substrate, applying lens/filter to substrate with light barrier, providing cover/wood veneer (composite with backing), joining wood veneer to substrate with light barrier and lens/filter, providing light source (with module), and joining wood veneer and substrate with light barrier and lens/filter and light source/module As shown schematically in FIG. 22, the method/process may comprise the steps of providing decorative outer layer, applying masking to back side of outer layer, placing masked outer layer in tool, forming and cut masked outer layer into shape, cooling masked outer layer in fixture forming substrate, joining substrate and masked outer layer, providing light source, joining light source and substrate and masked outer layer to forming component.

As shown schematically in FIG. 23, the method/process may comprise the steps of providing cover/wood grain (layer structure), applying light barrier/mask to cover/wood grain, applying lens/filter to cover/wood grain with light barrier/mask, placing cover/wood grain with light barrier/mask and lens/filter in hot tool, forming cover/wood grain with light barrier/mask into shape, cooling cover/wood grain with light barrier/mask in fixture, placing cover/wood grain with light barrier/mask in injection mold, injecting transparent polymer in injection mold behind cover/wood grain with light barrier/mask, assembling composite structure of cover/wood grain (layer) and light barrier/mask and substrate with light source/module.

As shown schematically in FIG. 24, the method/process may comprise the steps of providing cover/wood veneer (composite with backing), applying light barrier/mask to cover/wood veneer, forming apertures in light barrier/mask, placing cover/wood veneer with light barrier/mask and lens/filter in hot tool, forming cover/wood veneer with light barrier/mask into shape, cooling cover/wood veneer with light barrier/mask in fixture, placing cover/wood veneer with light barrier/mask in injection mold, injecting transparent polymer in injection mold to forming light guide layer on cover/wood veneer with light barrier/mask, providing substrate with light source/module, assembling composite structure of light guide layer with light barrier/mask and cover/wood veneer to substrate with light source/module.

As indicated schematically in the FIGURES, the composite structure/component may be produced and assembled in a variety of forms by a variety of processes/methods according to an exemplary embodiment; the composite structure/component with display for a vehicle interior may be provided with a variety of configurations to serve a variety of purposes. See e.g. FIGS. 20-24.

EXEMPLARY EMBODIMENTS

According to an exemplary embodiment as shown schematically in FIGS. 1A, 1B and 2A-2B, a vehicle V may include a vehicle interior I providing vehicle interior components C (e.g. shown as panels, consoles, compartments, etc.) that may be configured to provide a display D (e.g. display panel, illumination, data display, display screen, etc.) to present information, alerts, entertainment, data, etc. to a vehicle occupant (e.g. data/information as may be available from various sources such as image IM as shown in FIGS. 2A-2B, 3 and 4A-4B). As shown schematically in FIGS. 1B and 2A-2B, the vehicle interior may be provided with a variety of display configurations in a variety of positions and locations to serve a variety of purposes (e.g. for a panel, an instrument panel, a door panel, a table, a table surface, a console, a floor console, a center console, a functional surface, a cover, a cover for a compartment, a cover for an adaptive volume compartment; at least one of a trim panel; an armrest; a headliner; a dashboard; a console; a center console; a door panel; a steering wheel; a seat; a pillar, a roof pillar, pillar trim, etc.). See also FIGS. 5A-5C and 6A. According to an exemplary embodiment, the component may comprise a trim component, panel, console, etc. provided within the vehicle interior (e.g. instrument panel, door, seat area, cockpit, center area, overhead, etc.). See e.g. FIGS. 1B and 2A-2B.

As indicated schematically according to an exemplary embodiment in FIGS. 2A-2B, 3 and 4A-4B, the display D of the component C may present an image IM and/or information (e.g. data/information, instrumentation, indicators, controls, entertainment, communications, etc.). See also FIGS. 12B, 15B, 16B, 17B, 18B and 19B. According to an exemplary embodiment, the component C and/or display D (if provided on the component) may provide a contoured form/shape designed/intended to integrate with the interior design/aesthetic of the vehicle V. According to an exemplary embodiment, the component C may be provided with a visual effect and formed (e.g. shaped/contoured) with an ornamental design/appearance to fit the vehicle interior configuration.

As shown schematically according to an exemplary embodiment in the FIGURES, the vehicle interior component/system may comprise a cover/surface material to present a surface effect and may be configured to provide a user interface with a display at the cover/surface so that when the display is unilluminated the surface effect of the material of the surface is visible and when the display is illuminated a display of light from a light source is visible at and/or on the surface.

According to an exemplary embodiment, the display is configured to present content (e.g. graphic, text, etc.) with a graphic/image size, spacing etc. intended for image clarity and/or visibility/legibility (e.g. selection of any of size, color, spacing, icon, format, font, font size, etc.) for the selected cover material (e.g. surface effect, thickness, transparency/translucence, color, etc.); the light source may comprise a display panel (e.g. addressable display such as for a computing device) and/or an LED or LED module (e.g. a light or set of lights that may be selectively illuminated or activated on/off or etc.).

According to an exemplary embodiment as shown schematically, the component may comprise a composite structure comprising a cover (e.g. light-colored veneer/wood with a light grain in a thickness of between 0.2 and 0.6 mm thickness, such as a bamboo and translucent backing with thickness of 0.4 mm) and an applied coating such as a protective clear-coat material (e.g. protective coating for the veneer applied by spray, roller, brushing, etc. such as used as a protectant for furniture, etc.); a light-transmissive section such as a lens, filter, etc. (e.g. an optically clear/transparent lens of glass or plastic with a thickness of less than 1.75 mm such as of chemically-strengthened glass (e.g. Gorilla Glass as commercially available from Corning Inc. or equivalent) in a thickness of approximately 1.1 mm). (As indicated schematically according to an exemplary embodiment, the composite structure of the cover and lens arrangement may comprise a thickness of approximately 2.5 mm.)

According to an exemplary embodiment the composite structure of the component may comprise a sensor such as a capacitive grid/mat (e.g. a generally/effectively transparent flexible capacitive mat such as in a thickness of approximately 0.1 mm) configured for use with the user interface (e.g. as a touch input/interface, touch sensor, proximity sensor, etc.).

According to an exemplary embodiment, the light source may comprise a display/display panel (e.g. configured to provide suitable resolution, brightness, etc. such as example resolution of 1024×768 pixels/inch with example brightness greater than 700 cd per square meter, for example approximately 1500 cd per square meter); as indicated the selection of the light source/operating parameters for the light source (e.g. display/display panel, LED/LED array etc.) is in correspondence with the selection of the materials/construction of the surface (e.g. cover material, backing layer, thickness, color, etc.); variations in the resolution and brightness may be provided for implementation of the display/composite structure in various vehicle interior components (e.g. a panel; an instrument panel; a door panel; a trim panel; a table; a table surface; a surface; a console; a floor console; a center console; an overhead console; a functional surface; a cover; a cover for a compartment; a cover for an adaptive volume compartment; a receptacle, a cover for a receptacle, a cover for an adaptive volume receptacle, a mobile device holder, a cup holder, a storage area; a sidewall, an armrest; a headliner; a dashboard; a center console; a steering wheel; a seat; seat trim; a pillar; a roof pillar; pillar trim; autonomous vehicle trim panel; autonomous vehicle trim; autonomous vehicle component, etc.).

According to an exemplary embodiment, the composite structure of the component may comprise a spacing/air gap at the interface with the light source/display and the touch sensor (e.g. capacitive mat, etc.) intended to enhance feel/functionality with the touch sensor, to protect the display panel, etc.

According to an exemplary embodiment, the composite structure of the component may comprise a mask/frit (e.g. border section) configured to block/direct light for the display (e.g. intended to reduce/prevent loss/leakage of light at the transition/border).

According to an exemplary embodiment, the component/trim component will be configured to present at the cover a surface with a "natural" wood appearance as the surface effect (e.g. in default/ambient conditions) in the vehicle interior (e.g. generally stable/continuous visible surface effect with no indication of the image display functionality) when the image display functionality is not in operation; the component/trim component will be configured to present a "backlit" effect/display at the surface of the cover (e.g. visible with clarity notwithstanding the surface effect) for a display (e.g. such as for image, graphic, text, user interface, etc.) for the vehicle interior with the image display functionality is in operation. As indicated schematically, the image display functionality may comprise any of a wide variety of content including but not limited to icons, functional icons, decorative elements, patterns, indicator, graphics, text, effects, animated effects, colors, filters, etc. (e.g. individually and/or in combination, patterns, sequence, etc.). As indicated schematically, the surface of the cover of the component is configured to operate as a display surface in the vehicle interior with the image display functionality is in operation (e.g. configured to present graphics, text, information, user interface/interaction, etc.); when the image display functionality is not in operation the surface of the cover of the component will generally appear as a continuous standard surface for a vehicle interior (e.g. with virtually no visible indication of the image display components/system or functionality otherwise available for operation). As indicated schematically, the image display functionality may be configured by selection and/or operation of the system components (e.g. selection/arrangement of mask, back-lighting operation, display/data communication, information/network communications, etc.); the visible surface effect may be configured by selection and/or arrangement of the materials (e.g. selection of cover material, thickness/dimensions, layer construction, etc.).

According to an exemplary embodiment, the system may be configured to provide image display functionality for indication of the user interface configured to present at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an interface configured as a selective information display, among other indications (e.g. by operation and/or interconnection with a network/computing system, etc.).

According to an exemplary embodiment as shown schematically, the component may comprise a composite structure comprising a cover (e.g. light-colored veneer/wood panel configured to be back-lit at least in a specific area with image/graphics, color, icon/elements, etc.); a light-transmissive section such as a lens, filter, film/layer, colorant, etc. may be provided; a mask/masking layer may be provided (e.g. a light-blocking layer/material configured selectively to include graphics/elements for illumination selectively from the light source); the mask/masking layer may comprise a film/layer, a coating, an applied coating/ink layer, an applied paint/coating layer, an applique/decal, etc.; the mask/layer may have an arrangement of apertures/openings configured to provide the intended image (e.g. graphic, text, etc.) effect. According to an exemplary embodiment, the mask/mask layer may be configured to present an effect such as a desired surface effect (e.g. such as a grain/wood grain effect) intended to produce and/or enhance surface effect presented by the cover/layer material (e.g. matching the grain/wood grain effect of the cover material/veneer to further enhance the intended default/standard visual effect when the image/display functionality is not in operation).

According to an exemplary embodiment, the composite structure of the component may comprise a sensor such as a capacitive grid/mat (e.g. a grid, foil, film, flexible circuit/layer, etc. as a generally/effectively transparent flexible capacitive mat) configured for use with the user interface (e.g. as a touch input/interface, touch sensor, proximity sensor, etc.); the sensor may comprise a proximity sensor (e.g. detector, etc.) configured to activate and/or for operation of the image display functionality of the component/system.

According to an exemplary embodiment, the light source may comprise a module, LED/LED array, display/display panel (e.g. configured to provide suitable brightness and resolution for the configuration); the module may comprise associated control electronics, system connectivity, integrated functionality (e.g. lighting and/or touch sensor, etc.), etc. As shown schematically, the light source may comprise a display panel, light panel, a light box/assembly, an LED array/grid, etc.; as indicated schematically, a multi-color lighting/LED array and/or display panel may be used to provide multi-color functionality for the display at the surface of the component (e.g. configured to provide colors, to change colors, etc.). As indicated schematically, a lens/filter arrangement may be provided with the light source (e.g. to enhance and/or modify the light intensity, provide diffusion, alter/modify color, filter light, etc.); treatments may be provided and/or selected for the lens/filter arrangement to facilitate the display (e.g. form, intensity, color, etc.) of images at the surface of the component. As indicated schematically, the light source for the component/system may comprise one source or a set/series of sources (e.g. including multiple types/placement of sources and elements, such as LEDs, arrays/panels, modules, light guides, channels, patches, fiber optic elements, back lighting, etc.) arranged to provide the user interface/display as intended for the surface of the component in the vehicle interior. According to an exemplary embodiment, the component (e.g. module for the component, etc.) may comprise a cooling system (e.g. for the display, electronics, etc.) such as a heat sink, ventilation system, fan, etc.

As indicated schematically according to an exemplary embodiment, the vehicle interior component/system is configured with a surface of a material and configured with a display so that when the display is unilluminated the surface effect of the material of the surface is visible and when the display is illuminated a display of light from a light source is visible at and/or on the surface. According to an exemplary embodiment, the cover/surface material may comprise a light wood trim, veneer from light-color species of wood (e.g. bleached basswood, bamboo, aspen, specialty woods, engineered wood, composite materials, synthetic/artificial wood appearance, etc.); the cover/surface material may be selected (and sized/dimensioned in thickness) to provide a texture/grain effect (e.g. aesthetic/appearance, ornamental effect, color, shade, etc.) and to remain predominantly visible as the surface effect for the cover/surface when the display system/user interface is not in operation and to provide suitable/effective light transmission/transparency (e.g. to transmit with no unsuitable diffusion/scattering of light) to provide clarity at the display at the cover/surface for the user interface when the display system/user interface is in operation. See e.g. FIGS. 12A-12C and 14A-14C. According to an exemplary embodiment, the cover may comprise sections/segments of a veneer/sheet that are secured by a suitable adhesive/tape (e.g. compatible with the materials and coating, flexible, resilient, etc.); the cover may comprise a composite with a light-transmitting (e.g. substantially transparent/translucent) backing layer such as a paper sheet, fiber sheet, film, plastic film, plastic sheet, non-woven material, etc. configured to provide a base/structure for the cover (e.g. to provide reinforcement while maintaining suitable flexibility, in an assembly step, as a pre-form, etc.). The cover may comprise a material such as a wood/bamboo, etc. (or a synthetic wood-appearance material, etc.) that is arranged to provide a suitable appearance/aesthetic (e.g. shade, color, texture/grain, linearity and regularity/irregularity of texture, depth/degree of grain, etc.) for the application as well as the light-transmitting property for the application (e.g. transparency to facilitate image display by back-light from the light source).

According to an exemplary embodiment shown schematically/representationally in FIGS. 2A, 3, 4A-4B, 5A-5D, 7, 8A-8C, 10A-10D, 12A-12C, 15A-15C and 19A-19C, a vehicle interior component may be configured provide a user interface comprising a display configured to present an image when illuminated by a light source; the component may comprise a composite structure comprising a cover and a substrate. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The surface effect of the cover may comprise at least one of (a) grain texture or (b) wood texture. The material of the cover may comprise a wood veneer. The substrate may comprise a backing for the cover; the backing may comprise at least one of (a) a paper; (b) a fiber material; (c) a film; (d) a plastic film. The composite structure may further comprise a light-blocking layer. The light-blocking layer may comprise at least one of (a) a mask; (b) a mask layer. The composite structure may further comprise a light-transmissive element. The light-transmissive element may comprise at least one of (a) a lens; (b) a filter; (c) a colorant. The composite structure may further comprise a sensor for the user interface. The sensor may comprise at least one of (a) a capacitive sensor; (b) a capacitive array; (c) a capacitive grid; (d) a proximity detector. The composite structure may comprise a gap between the sensor and the light source. The light source may comprise at least one of (a) a display panel; (b) an LED; (c) an LED array; (d) a module. The module may comprise at least one of (a) an LED; (b) an LED array; (c) a display panel; (d) a sensor. The user interface may comprise image display functionality; when the image display functionality is not in operation the surface effect of the cover may be presented and when the image display functionality is in operation the light source may be configured to provide a backlit effect for display of the image at the surface of the cover. The surface effect of the cover may be visible when the image display functionality is in operation. The surface effect of the cover may comprise a wood grain appearance. When the image display functionality is not in operation the surface effect of the cover may be presented with substantially no indication of image display functionality.

The display may be configured for at least one of (a) to present an image; (b) to present information; (c) to present a graphic; (d) to present text; (e) to present a graphic and text; (f) to present the user interface. The display may be configured as at least one of (a) an information region; (b) an instrumentation region; (c) a functional region; (d) a decorative region; (e) the user interface. The composite structure may further comprise a mask layer comprising a light transmissive section and a generally opaque section. The mask layer may comprise an open section. The mask layer may comprise an image section providing at least one aperture. The mask layer may comprise an open section and an image section. The light-transmissive effect for the cover may comprise at least one of (a) transmission of light; (b) translucence; (c) general transparence. The surface effect of the cover may comprise at least one of (a) grain effect; (b) wood grain effect; (c) wood appearance effect; (d) bamboo texture effect; (e) bamboo appearance effect; (f) basswood appearance effect; (g) aspen wood texture effect. The light source may comprise at least one of (a) a module; (b) a light; (c) an LED; (d) an LED array; (e) a display panel. The light source may be configured to present a single-color display. The light source may be configured to present a multi-color display. The light source may comprise at least one of (a) a single-color LED; (b) a multi-color display; (c) a multi-color LED array; (d) a light source configured to be projected through a colorant. The light source may be configured to present a single-color display. The surface effect may be a visible surface effect in ambient conditions. The component may further comprise a cover composite comprising the cover and a backing. The backing may comprise a backing layer. The backing layer may comprise at least one of (a) a paper; (b) a film; (c) a plastic film; (d) a light-transmissive material. The component may further comprise a cover assembly comprising the cover composite comprising a veneer and a backing comprising a backing layer for the veneer. The display may comprise at least one of (a) a region; (b) a display region configured to display an image; (c) an information display region configured to display information; (d) an instrumentation region configured to display information relating to a vehicle system; (e) a decorative region configured to display a decorative image; (f) a decorative region configured to display an ornamental appearance; (g) a decorative region configured to display information; (h) a functional region configured to display an image relating to the function of a vehicle system; (i) a functional region configured to facilitate interaction with a vehicle system; (j) a functional region configured to indicate a function of a vehicle system; (k) the user interface.

The component may comprise at least one of a panel; an instrument panel; a door panel; a trim panel; a table; a table surface; a surface; a console; a floor console; a center console; an overhead console; a functional surface; a cover; a cover for a compartment; a cover for an adaptive volume compartment; a receptacle, a cover for a receptacle, a cover for an adaptive volume receptacle, a mobile device holder, a cup holder, a storage area; a sidewall, an armrest; a headliner; a dashboard; a center console; a steering wheel; a seat; seat trim; a pillar; a roof pillar; pillar trim; autonomous vehicle trim panel; autonomous vehicle trim; autonomous vehicle component.

According to an exemplary embodiment shown schematically/representationally in FIGS. 2A, 3, 4A-4B, 5A-5D, 7, 8A-8C, 10A-10D, 12A-12C, 15A-15C and 19A-19C, a vehicle interior component may be configured provide a user interface comprising a display configured to present an image when illuminated by a light source; the component may comprise a composite structure comprising (a) a cover; (b) a substrate; and (c) a light-transmissive segment. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The light-transmissive segment may comprise at least one of (a) a mask; (b) a lens; (c) a filter; (d) a colorant. The light-transmissive segment may comprise a lens. The light-transmissive segment may comprise at least one of (a) a filter; (b) a colorant. The light-transmissive segment may comprise a mask. The mask may comprise an opaque section and an image section comprising at least one aperture configured to display an image when illuminated by a light source. The image section may comprise an opening providing a frame for display of an image from a display panel. The substrate may comprise a structure for the cover and the light-transmissive segment. The composite structure may comprise the cover; a backing for the cover; a lens. The composite structure may comprise the cover; a backing for the cover; a mask layer; and the substrate may comprise a structure for attachment to the light source. The composite structure may comprise the cover; a backing for the cover; a mask layer; a lens; an air gap above the light source.

According to an exemplary embodiment shown schematically/representationally in FIGS. 2A, 3, 4A-4B, 5A-5D, 7, 8A-8C, 10A-10D, 12A-12C, 15A-15C and 19A-19C, a vehicle interior component may be configured provide a user interface comprising a display configured to present an image when illuminated by a light source; the component may comprise a composite structure comprising (a) a cover; (b) a substrate; and (c) a light-transmissive segment. The cover may comprise a material configured to provide a light-transmissive effect and providing a surface configured to provide a surface effect. The composite structure may be configured to present the surface effect on the surface of the cover when the display is not illuminated by the light source and to present the image at the surface of the cover when the display is illuminated by the light source. The substrate of the composite structure may comprise at least one of (a) a backing for the cover; (b) a structure for the cover. The light source may comprise a module configured to provide the user interface. The surface effect of the surface of the cover may be configured to be presented as a wood texture appearance. The display may be configured to present an image at the surface of the cover when the light source is illuminated. The image may be presented through the surface effect of the surface of the cover. The image may be projected by the light source for display at the surface of the cover. The light-transmissive segment may comprise at least one of (a) a lens; (b) a mask. The module may comprise at least one of (a) a display panel; (b) an LED; (c) an LED array. The module may comprise a sensor. The module may comprise a sensor and a display. The module may comprise a display panel and an LED array. The module may comprise a light source and a display panel. The module may be configured to interact with a vehicle system. The module may be configured for connection to a network. The light-transmissive segment may comprise a mask layer comprising a frame section and an image section. The user interface may be configured to present at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an interface configured as a selective information display. The composite structure may further comprise a sensor. The sensor may comprise a touch sensor configured to provide the user interface. The sensor may comprise a touch sensor configured to provide a proximity sensor. The sensor may comprise a proximity sensor configured to detect proximity of a vehicle occupant for interaction with the user interface. The sensor may comprise a proximity sensor for a compartment.

According to an exemplary embodiment shown schematically/representationally in FIGS. 2A, 3, 4A-4B, 5A-5D, 7, 8A-8C, 10A-10D, 12A-12C, 15A-15C and 19A-19C, a component for a vehicle interior with a surface intended to be visible to an occupant when the component is installed in the vehicle interior. The component may comprise a base; a decorative layer coupled to the base; and a cover coupled to the decorative layer comprising an outer layer. The cover may comprise a laminate. The base may comprise a nonplanar surface and the cover may comprise an inner layer; the inner layer of the cover and the outer layer of the cover may be nonplanar. The inner layer of the cover may be configured to align with the nonplanar surface of the base. The decorative layer may comprise at least one of a foil or a film. The decorative layer may be laminated to the base. The component may further comprise an adhesive configured to couple the decorative layer to the cover. The adhesive may be configured to transmit light passing from the cover to the decorative layer. The cover may comprise a wood veneer. The cover may comprise plastic wood laminate. The decorative layer may comprise at least a portion configured to prevent visibility of the base. The decorative layer may comprise at least one of (a) ink (b) paint (c) a foil (d) a film configured to prevent illumination to pass from a display to the cover. The decorative layer may comprise at least a portion configured to allow illumination to pass from a display to the cover. The component may comprise a sensing layer; the sensing layer may comprise at least one of (a) an electrical circuit; (b) a sensor; (c) a capacitive switch; (d) a capacitive switch sensor. The decorative layer may comprise an opening; the opening may be configured to at least one of (a) expose the base; (b) uncover the base. The decorative layer may be configured to provide a visual effect; the cover may be configured to provide a visual effect; the visual effect of the decorative layer and the visual effect of the cover may be configured to provide a composite visual effect.

According to an exemplary embodiment shown schematically/representationally in FIGS. 2A, 3, 4A-4B, 5A-5D, 7, 8A-8C, 10A-10D, 12A-12C, 15A-15C and 19A-19C, a component for a vehicle interior providing a composite visual effect may comprise a base; a decorative layer providing a visual effect and coupled to the base; and a cover providing a visual effect, the cover coupled over the decorative layer. The composite visual effect may be provided by the visual effect of the decorative layer and the visual effect of the cover. The base may comprise a nonplanar surface and the cover may comprise an inner surface and an outer surface; the inner surface of the cover and the outer surface of the cover may be nonplanar. The inner surface of the cover may be configured to align with the nonplanar surface of the base. The cover may comprise at least one of (a) wood; (b) plastic wood veneer; (c) artificial wood. The cover may comprise a nonplanar form. The decorative layer may be laminated to the base. The decorative layer may comprise at least one of (a) a sheet; (b) a foil; (c) a film. The component may further comprise an adhesive configured to couple the decorative layer to the cover. The adhesive may be configured to transmit light from the cover to the decorative layer. The visual effect of the cover may comprise at least one of: (a) wood; (b) wood grain. The visual effect of the decorative layer may comprise at least one of: (a) wood; (b) wood grain. The visual effect of the cover may comprise a transition between two visual effects. The cover may further comprise a film; the film may comprise at least a portion configured to absorb light from a display.

According to an exemplary embodiment shown schematically/representationally in FIGS. 2A, 3, 4A-4B, 5A-5D, 7, 8A-8C, 10A-10D, 12A-12C, 15A-15C and 19A-19C, a component for a vehicle interior configured to be illuminated by a light source and with a surface intended to be visible to an occupant when the component is installed in the vehicle interior may comprise a cover; a layer coupled to the cover; and a base. The cover may comprise at least one of wood or wood grain. The component may further comprise a sensor layer comprising at least one of (a) an electrical circuit; (b) a sensor; (c) a capacitive sensor; (d) a capacitive switch; (e) a sensor; (f) an array; (g) a grid; (h) a panel; (i) a film; (j) a foil. The cover may be configured to be backlit by the light source. The surface intended to be visible to an occupant may comprise a continuous wood surface when not illuminated by the light source. The surface intended to be visible to an occupant may comprise at least one of (a) an icon; (b) a decorative element; (c) a graphic; (d) an indicator; (e) an animated effect; (f) a graphical element when illuminated by the light source. The light source may comprise at least one of (a) an LED; (b) a light changing LED; (c) a light guide; (d) a fiber optic patch. The layer may comprise a decorative layer. The layer may comprise at least one of (a) a light blocking material; (b) paint; (c) a film; (d) a decal; (e) a foil; (f) an applique. The layer may comprise a mask. The layer may comprise at least one of (a) a window; (b) an aperture; (c) an opening configured to allow illumination to pass from the light source to the cover.

According to an exemplary embodiment shown schematically/representationally in FIGS. 20-24, a method of manufacturing a vehicle trim component may comprise comprising the steps of: providing a base; joining a decorative layer to the base to create a decorative base; and joining a cover to the decorative layer. At least a portion of the decorative layer may be configured to allow illumination to pass from the cover to the base. The decorative layer may comprise at least one of (a) ink (b) paint (c) a foil (d) a film. At least a portion of the decorative layer may be configured to transmit light passing from a light source to the cover. At least a portion of the decorative layer may be configured to prevent transmission of light passing from the cover to the base. The method may comprise the step of joining at least one of (a) an electrical circuit; (b) a sensor; (c) a capacitive switch; (d) a capacitive switch sensor to at least one of the decorative layers; the base. Joining the cover to the decorative layer may comprise applying an adhesive to at least one of (a) the cover; (b) the decorative layer; the adhesive may be configured to allow illumination to pass from the cover to the decorative base.

According to an exemplary embodiment shown schematically/representationally in FIGS. 2A, 3, 4A-4B, 5A-5D, 7, 8A-8C, 10A-10D, 12A-12C, 15A-15C and 19A-19C, a vehicle interior component may comprise a composite structure comprising a surface/cover providing a surface effect and configured to be illuminated in a region such as an information/instrumentation region, a decorative region and/or a functional region by a light source/module so that the surface effect of the surface will be visible (e.g. predominantly visible as a standard surface/cover without other substantial indication) when the light/source module is uni-lluminated and a display of an image will be visible (e.g. image displayed with appropriate intensity/clarity) through the surface effect of the surface when the light/source module is illuminated.

According to an exemplary embodiment, the component may be configured for any of a wide variety of vehicles (including but not limited to driver vehicles, autonomous vehicles, etc.) and may comprise at least one of a panel; an instrument panel; a door panel; a trim panel; a table; a table surface; a surface; a console; a floor console; a center console; an overhead console; a functional surface; a cover; a cover for a compartment; a cover for an adaptive volume compartment; a receptacle, a cover for a receptacle, a cover for an adaptive volume receptacle, a mobile device holder, a cup holder, a storage area; a sidewall, an armrest; a headliner; a dashboard; a center console; a steering wheel; a seat; seat trim; a pillar; a roof pillar; pillar trim; autonomous vehicle trim panel; autonomous vehicle trim; autonomous vehicle component, etc.

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

The invention claimed is:

1. A vehicle interior component configured to provide a user interface comprising a display configured to present an image when illuminated by a light source comprising:
a composite structure comprising a cover and a substrate;
wherein the cover comprises a material configured to provide a light-transmissive effect and providing a surface configured to provide a surface effect;
wherein the composite structure is configured to present the surface effect on the surface of the cover when the display is not illuminated by the light source and to present the image at the surface of the cover when the display is illuminated by the light source;
wherein the substrate of the composite structure comprises at least one of (a) a backing for the cover; (b) a structure for the cover;
wherein the material of the cover comprises a wood veneer;
wherein the user interface comprises image display functionality;
wherein image display functionality comprises an interface configured as a selective information display;
wherein the composite structure comprises a light-transmissive element;
wherein the light-transmissive element comprises a filter;
wherein the light-transmissive element comprises a lens;
wherein the lens comprises a colorant;
wherein the composite structure comprises a sensor for the user interface.

2. The component of claim 1 wherein image display functionality comprises at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an animated effect.

3. The component of claim 1 wherein the sensor for the user interface comprises a proximity detector.

4. The component of claim 1 wherein the user interface comprises image display functionality; wherein when the image display functionality is not in operation the surface effect of the cover is presented and when the image display functionality is in operation the light source is configured to provide a backlit effect for display of the image at the surface of the cover; wherein the surface effect of the cover is visible when the image display functionality is in operation.

5. The component of claim 1 wherein the composite structure further comprises a light blocking layer comprising a mask layer comprising a light transmissive section and a generally opaque section; wherein the mask layer comprises at least one of (a) an open section; (b) an image section providing at least one aperture; (c) an open section and an image section.

6. The component of claim 1 wherein the light-transmissive effect for the cover comprises at least one of (a) transmission of light; (b) translucence; (c) general transparence.

7. The component of claim 1 comprising at least one of (a) a panel; (b) an instrument panel; (c) a door panel; (d) a trim panel; (e) a table; (f) a table surface; (g) a surface; (h) a console; (i) a floor console; (j) a center console; (k) an overhead console; (l) a functional surface; (m) a cover; (n) a cover for a compartment; (o) a cover for an adaptive volume compartment; (p) a receptacle; (q) a cover for a receptacle; (r) a cover for an adaptive volume receptacle; (s) a mobile device holder; (t) a cup holder; (u) a storage area; (v) a sidewall; (w) an armrest; (x) a headliner; (y) a dashboard; (z) seat trim; (aa) a steering wheel; (bb) a seat; (cc) a pillar; (dd) a roof pillar; (ee) pillar trim; (ff) an autonomous vehicle trim panel; (gg) autonomous vehicle trim; (hh) an autonomous vehicle component.

8. A vehicle interior component configured to provide a user interface comprising a display configured to present an image when illuminated by a light source comprising:
a composite structure comprising a cover and a substrate;
wherein the cover comprises a material configured to provide a light-transmissive effect and providing a surface configured to provide a surface effect;
wherein the composite structure is configured to present the surface effect on the surface of the cover when the display is not illuminated by the light source and to present the image at the surface of the cover when the display is illuminated by the light source;
wherein the substrate of the composite structure comprises a backing for the cover;
wherein the composite structure comprises a light-transmissive segment;
wherein the material of the cover comprises a wood veneer; wherein the wood veneer comprises a light wood trim configured to provide light transmission;
wherein the backing for the cover comprises a light-transmissive backing layer; wherein the light-transmissive segment of the composite structure comprises the wood veneer and the backing for the cover;

wherein the light-transmissive segment of the composite structure comprises a lens providing a colorant and a filter effect for the cover;

wherein the user interface comprises image display functionality;

wherein the composite structure comprises (a) an opaque section comprising a frame and (b) an image section comprising an opening configured to present the image from the display to provide image display functionality at the user interface;

wherein the composite structure comprises a coating applied as a film over the cover;

wherein image display functionality comprises an interface configured as a selective information display at the image section of the composite structure.

9. The component of claim 8 wherein the wood veneer comprises a material with a thickness of between 0.2 mm and 0.6 mm.

10. The component of claim 8 wherein the light-transmissive segment comprises at least one of (a) a mask; (b) a lens; (c) a filter; (d) a colorant.

11. The component of claim 8 wherein image display functionality comprises at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an animated effect.

12. The component of claim 8 wherein the composite structure comprises the cover, a backing for the cover and a mask layer; and wherein the substrate comprises a structure for the cover and the light-transmissive segment.

13. A vehicle interior component configured to provide a user interface for a vehicle occupant comprising a display configured to present an image when illuminated by a light source comprising:

a composite structure comprising (a) a cover; (b) a substrate; (c) a module configured to provide the user interface; and (d) a sensor for the user interface;

wherein the cover comprises a material configured to provide a light-transmissive effect and providing a surface configured to provide a surface effect;

wherein the composite structure is configured to present the surface effect on the surface of the cover when the display is not illuminated by the light source and to present the image at the surface of the cover when the display is illuminated by the light source;

wherein the substrate of the composite structure comprises a backing for the cover;

wherein the composite structure comprises a light-transmissive segment;

wherein the light-transmissive segment comprises a lens; wherein the lens comprises a filter and a colorant;

wherein the material of the cover comprises a wood veneer;

wherein the material of the cover comprises a light-transmitting material for the light-transmissive segment;

wherein the backing for the cover comprises a light-transmitting backing layer providing reinforcement for the wood veneer;

wherein the surface effect of the surface of the cover is configured to be presented as a wood texture appearance;

wherein the wood texture appearance comprises a grain effect from the wood veneer;

wherein the user interface comprises image display functionality;

wherein image display functionality comprises an interface configured as a selective information display;

wherein the sensor is configured to detect proximity of the vehicle occupant for interaction with the user interface.

14. The component of claim 13 wherein image display functionality comprises at least one of (a) a menu; (b) an interactive menu; (c) an information display; (d) an interface configured for interaction with a vehicle occupant; (e) an interface configured for interaction by touch of a vehicle occupant; (f) an interface configured for interaction with a vehicle system; (g) an interface configured for interconnection to a network; (h) an animated effect.

15. The component of claim 13 wherein the display is configured to present an image at the surface of the cover when the light source is illuminated; wherein the display is configured for at least one of (a) to present an image; (b) to present information; (c) to present a graphic; (d) to present text; (e) to present a graphic and text; (f) to present the user interface.

16. The component of claim 15 wherein the image is presented through the surface effect of the surface of the cover.

17. The component of claim 15 wherein the image is projected by the light source for display at the surface of the cover.

18. The component of claim 13 wherein the module comprises at least one of (a) a display panel; (b) an LED; (c) an LED array; (d) a light source; (e) a display and a sensor.

19. The component of claim 13 wherein the module comprises a sensor; wherein the sensor comprises at least one of (a) a capacitive sensor; (b) a capacitive array; (c) a capacitive grid; (d) a proximity detector; (e) a touch sensor configured to provide the user interface; (f) a touch sensor configured to provide a proximity sensor; (g) a proximity sensor configured to detect proximity of the vehicle occupant for interaction with the user interface; (h) a proximity sensor for a compartment.

* * * * *